United States Patent
Nam et al.

(10) Patent No.: US 12,119,063 B2
(45) Date of Patent: Oct. 15, 2024

(54) MEMORY DEVICE AND OPERATION METHOD THEREOF

(71) Applicant: Samsung Electronics Co., Ltd., Suwon-si (KR)

(72) Inventors: Sang-Wan Nam, Hwaseong-si (KR); Hyunggon Kim, Hwaseong-si (KR); Bong-Kil Jung, Seoul (KR); Younho Hong, Seoul (KR); Juseong Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 94 days.

(21) Appl. No.: 17/957,532

(22) Filed: Sep. 30, 2022

(65) Prior Publication Data

US 2023/0138601 A1    May 4, 2023

(30) Foreign Application Priority Data

Nov. 4, 2021  (KR) .......................... 10-2021-0150932

(51) Int. Cl.
  *G11C 16/08*    (2006.01)
(52) U.S. Cl.
  CPC .................................. *G11C 16/08* (2013.01)
(58) Field of Classification Search
  CPC ............. G11C 16/08; G11C 8/08; G11C 8/12
  See application file for complete search history.

(56) References Cited

U.S. PATENT DOCUMENTS

| | | | |
|---|---|---|---|
| 6,563,746 B2 | 5/2003 | Fujioka et al. | |
| 7,649,785 B2 | 1/2010 | Byeon | |
| 7,701,784 B2 | 4/2010 | Maejima et al. | |
| 8,427,878 B2 | 4/2013 | Shim et al. | |
| 8,837,228 B2 | 9/2014 | Nam et al. | |
| 9,842,659 B2 | 12/2017 | Nam et al. | |
| 10,679,713 B2 | 6/2020 | Bushnaq et al. | |
| 2012/0275234 A1* | 11/2012 | Lee ........................ | G11C 16/16 365/185.23 |
| 2012/0300527 A1 | 11/2012 | Shim et al. | |
| 2015/0085576 A1 | 3/2015 | Yoo et al. | |

FOREIGN PATENT DOCUMENTS

| | | |
|---|---|---|
| JP | 2008-186498 A | 8/2008 |
| KR | 10-1998-0011500 U | 5/1998 |
| WO | WO-2007/130832 A2 | 11/2007 |

\* cited by examiner

*Primary Examiner* — Han Yang
(74) *Attorney, Agent, or Firm* — HARNESS, DICKEY & PIERCE, P.L.C.

(57) ABSTRACT

Disclosed is a memory device includes a memory block that is connected with a plurality of wordlines, a voltage generating circuit configured to output a first non-selection voltage through a plurality of driving lines, and an address decoding circuit configured to connect the plurality of driving lines with unselected wordlines of the plurality of wordlines. During a wordline setup period for the plurality of wordlines, the voltage generating circuit floats first driving lines corresponding to first unselected wordlines of the unselected wordlines from among the plurality of driving lines when the first unselected wordlines reach a first target level, and floats second driving lines corresponding to second unselected wordlines of the unselected wordlines from among the plurality of driving lines when the second unselected wordlines reach a second target level different from the first target level.

20 Claims, 29 Drawing Sheets

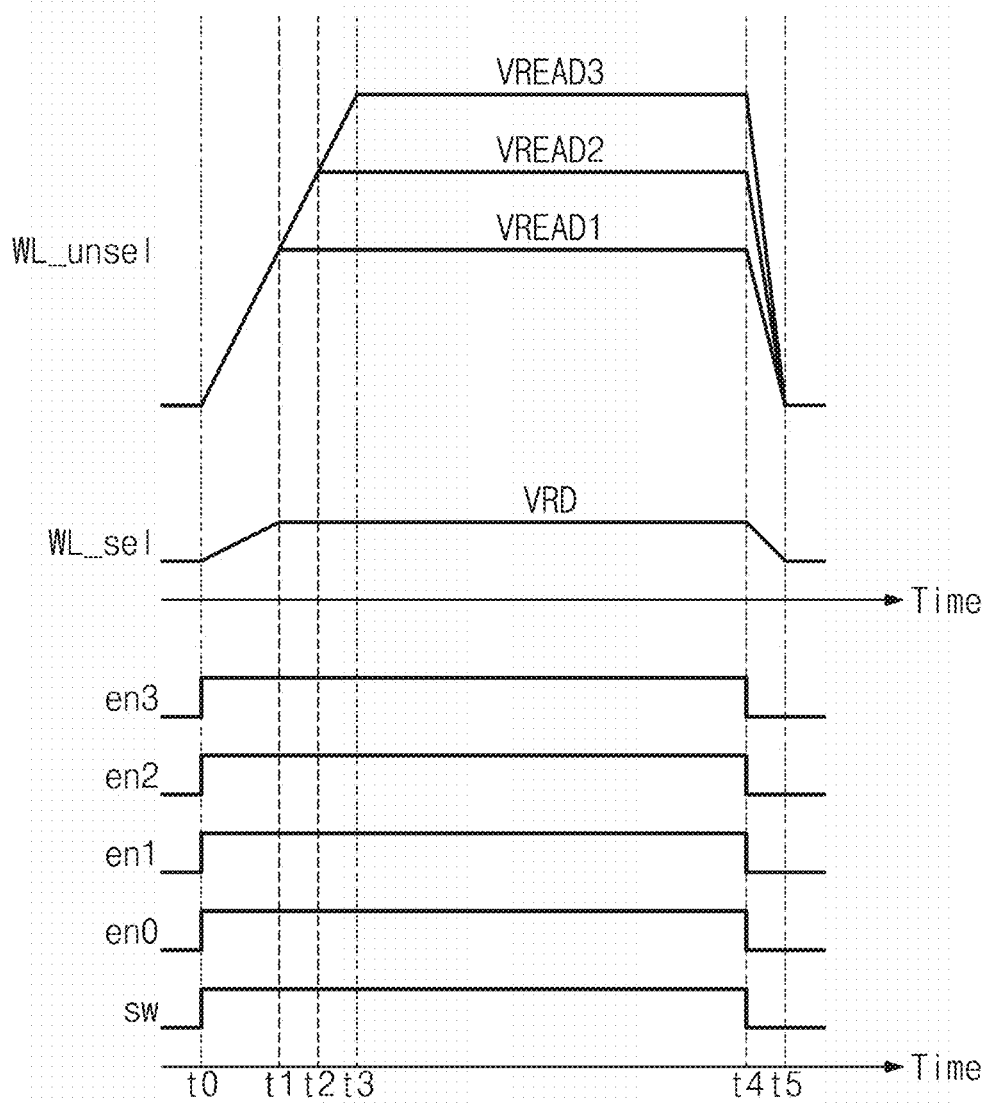

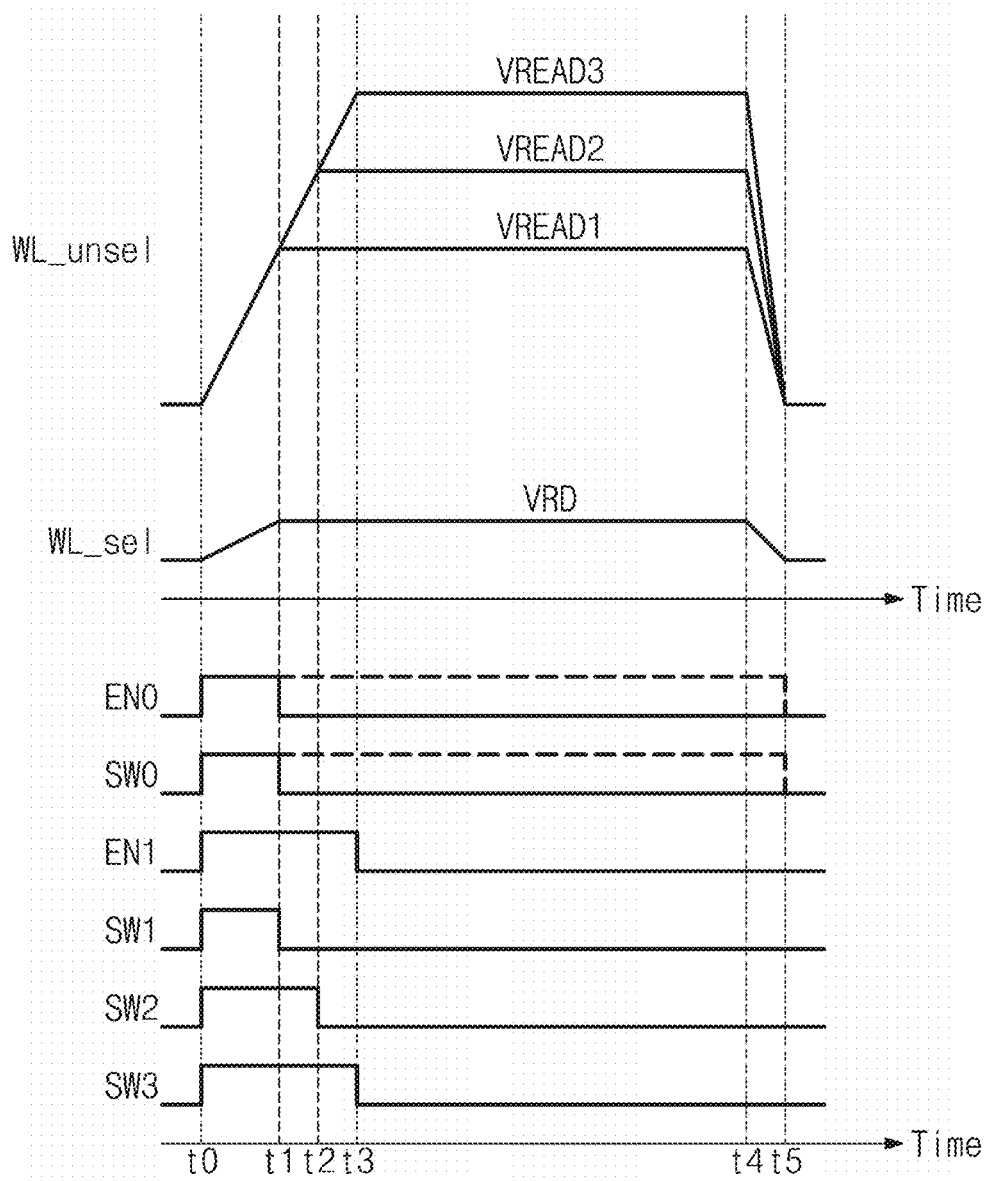

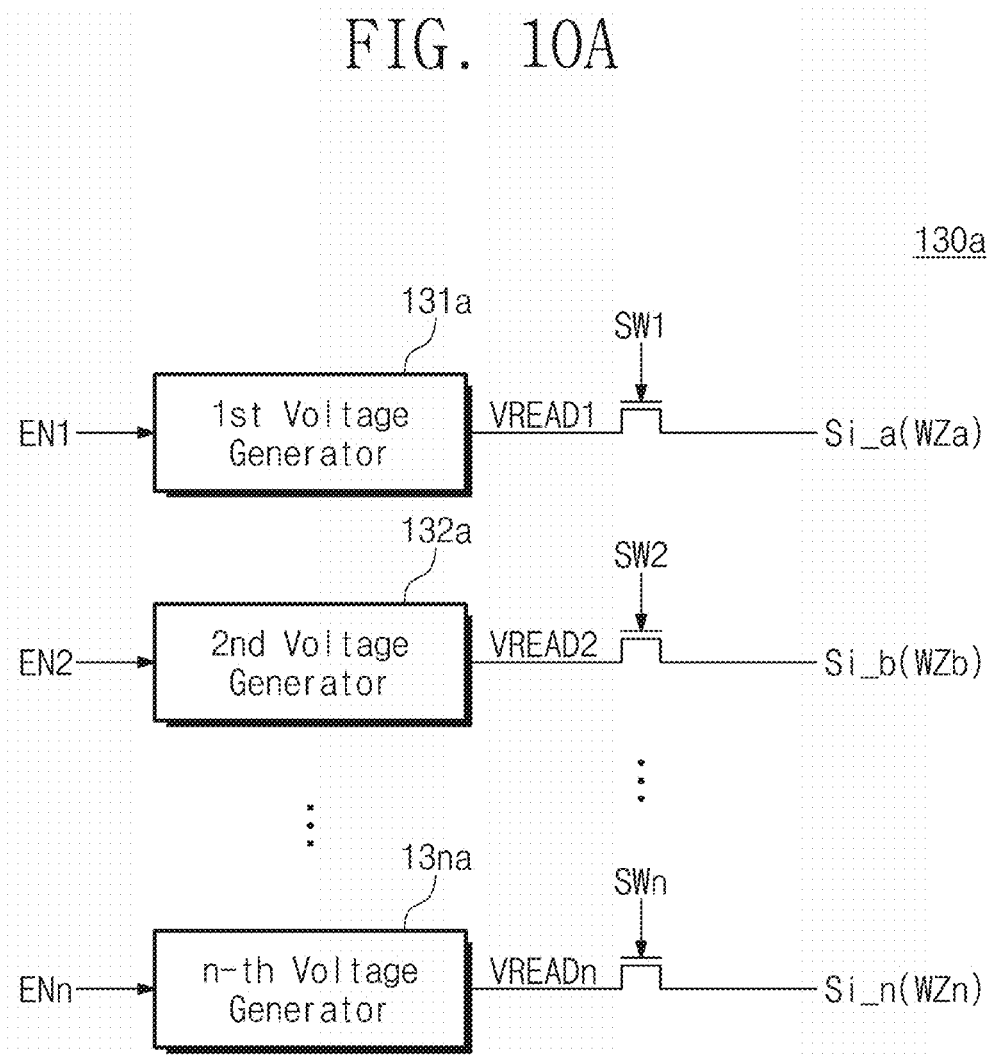

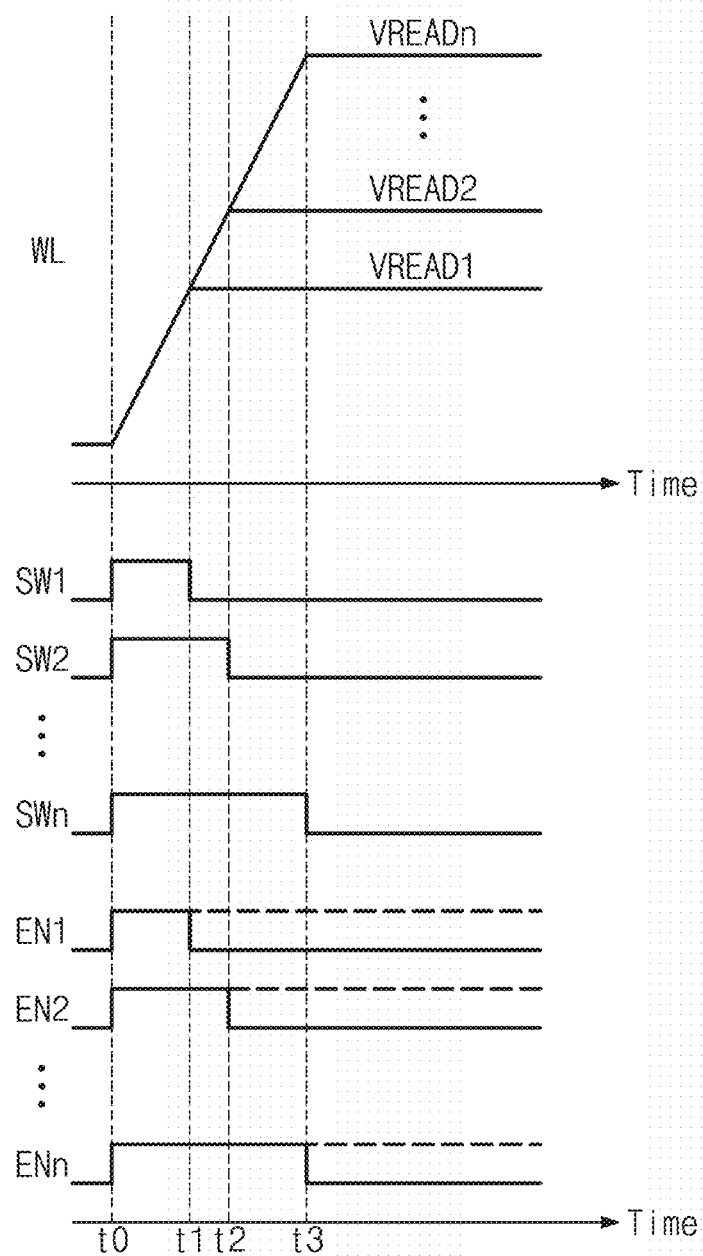

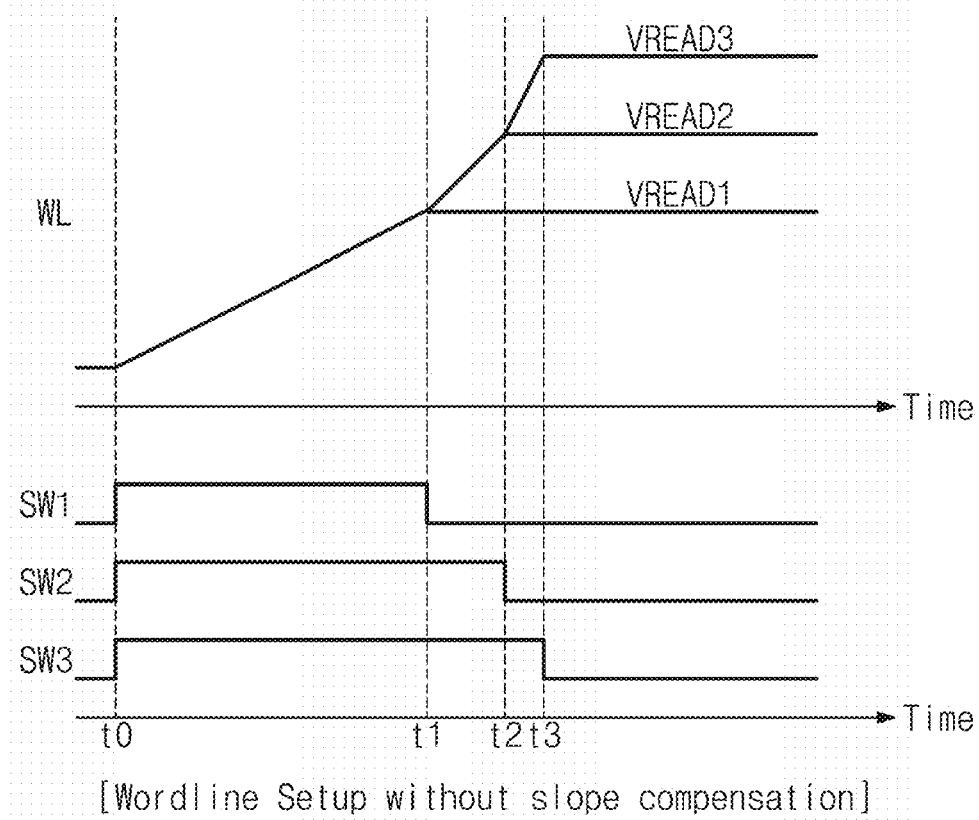

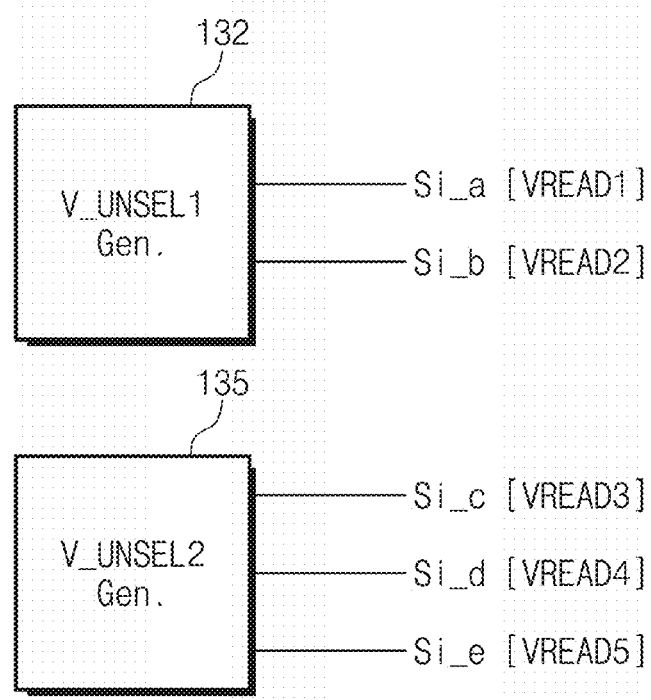

[Wordline Setup without slope compensation]

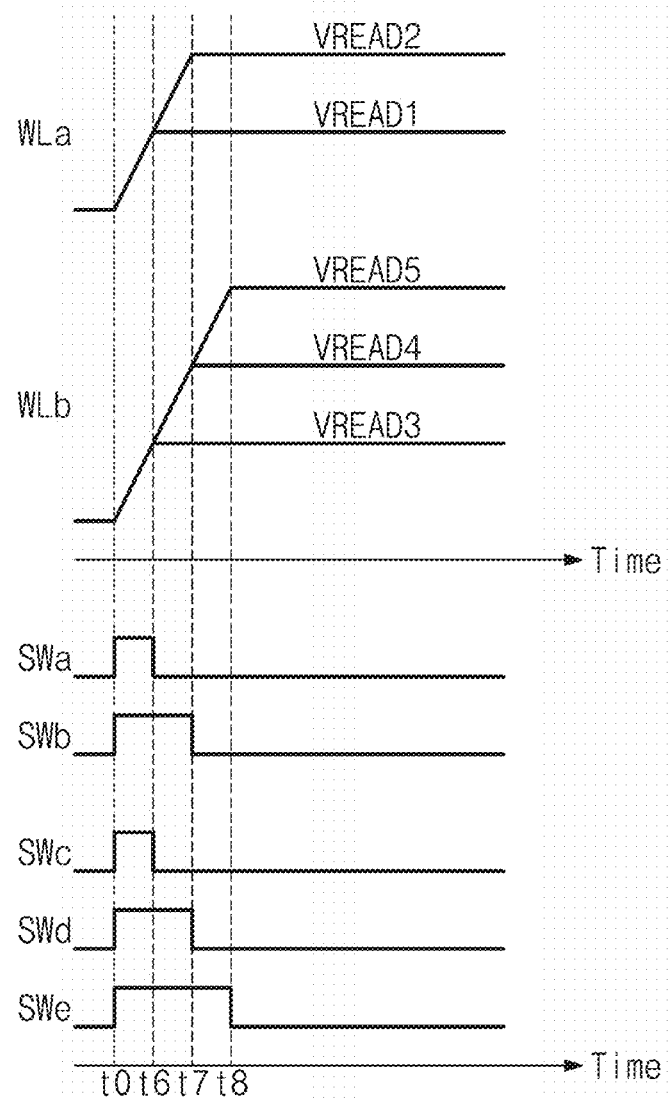

MEMORY DEVICE AND OPERATION METHOD THEREOF

CROSS-REFERENCE TO RELATED APPLICATIONS

This application claims priority under 35 U.S.C. § 119 to Korean Patent Application No. 10-2021-0150932, filed on Nov. 4, 2021 in the Korean Intellectual Property Office, the entire disclosure of which is incorporated by reference herein in its entirety.

BACKGROUND

Embodiments of the present disclosure described herein relate to a semiconductor memory, and more particularly, relate to a memory device and/or an operation method thereof.

A semiconductor memory device is classified as a volatile memory device, in which stored data disappear when a power supply is turned off, such as a static random access memory (SRAM) or a dynamic random access memory (DRAM), or a nonvolatile memory device, in which stored data are retained even when a power supply is turned off, such as a flash memory device, a phase-change RAM (PRAM), a magnetic RAM (MRAM), a resistive RAM (RRAM), or a ferroelectric RAM (FRAM).

The flash memory device is being widely used as a high-capacity storage medium of a user system. Nowadays, as the degree of integration of the flash memory device improves, the number of wordlines connected with one memory block may increase. Various voltages may be required to drive multiple wordlines, thereby causing an increase in the area of the flash memory device or an increase in power consumption.

SUMMARY

Embodiments of the present disclosure provide a memory device with the reduced area, reduced power consumption, and/or improved reliability, and/or an operation method thereof.

According to an embodiment, a memory device may include a memory block that is connected with a plurality of wordlines, a voltage generating circuit configured to output a first non-selection voltage through a plurality of driving lines, and an address decoding circuit configured to connect the plurality of driving lines with unselected wordlines among the plurality of wordlines. During a wordline setup period for the plurality of wordlines, the plurality of driving lines may include first driving lines corresponding to first unselected wordlines among the unselected wordlines and second driving lines corresponding to second unselected wordlines among the unselected wordlines, the voltage generating circuit may be further configured to float the first driving lines when the first unselected wordlines reach a first target level, and the voltage generating circuit may be further configured to float the second driving lines when the second unselected wordlines reach a second target level. The second target level may be different from the first target level.

According to an embodiment, a memory device may include a first voltage generator configured to output a first voltage, a second voltage generator configured to output a second voltage, a switch circuit configured to selectively connect an output of the first voltage generator with first driving lines and connect an output of the second voltage generator with second driving lines, a memory block connected with a plurality of wordlines, and an address decoding circuit configured to connect the first driving lines with first unselected wordlines of the plurality of wordlines and to connect the second driving lines with second unselected wordlines of the plurality of wordlines. The switch circuit may be configured to connect the output of the first voltage generator with the first driving lines and to float the first driving lines when the output of the first voltage generator reaches a first target level. The switch circuit may be configured to connect the output of the second voltage generator with the second driving lines and to float the second driving lines when the output of the second voltage generator reaches a second target level. The second target level may be different from the first target level.

According to an embodiment, an operation method of a memory device is provided. The memory device may include a memory block connected with a plurality of wordlines. The operation method may include applying a first voltage to unselected wordlines of the plurality of wordlines, floating first unselected wordlines of the unselected wordlines when the first unselected wordlines reach a first target level, and floating second unselected wordlines of the unselected wordlines when the second unselected wordlines reach a second target level. The second target level may be higher than the first target level. The first voltage may be generated from a first voltage generator.

BRIEF DESCRIPTION OF THE FIGURES

The above and other objects and features of the present disclosure will become apparent by describing in detail embodiments thereof with reference to the accompanying drawings.

FIG. 7B is a timing diagram for describing an operation of a voltage generating circuit of FIG. 7A.

FIG. 8B is a timing diagram for describing an operation of a voltage generating circuit of FIG. 8A.

FIG. 10A is a block diagram illustrating a voltage generating circuit of FIG. 1.

FIG. 10B is a timing diagram for describing an operation of a voltage generating circuit of FIG. 10A.

FIGS. 14A and 14B are timing diagrams for describing an operation of a voltage generating circuit of FIG. 13.

FIGS. 16A to 16C are diagrams for describing a voltage generating circuit of FIG. 15.

DETAILED DESCRIPTION

Below, embodiments of the present disclosure may be described in detail and clearly to such an extent that an ordinary one in the art easily implement embodiments of inventive concepts.

Figure 1:
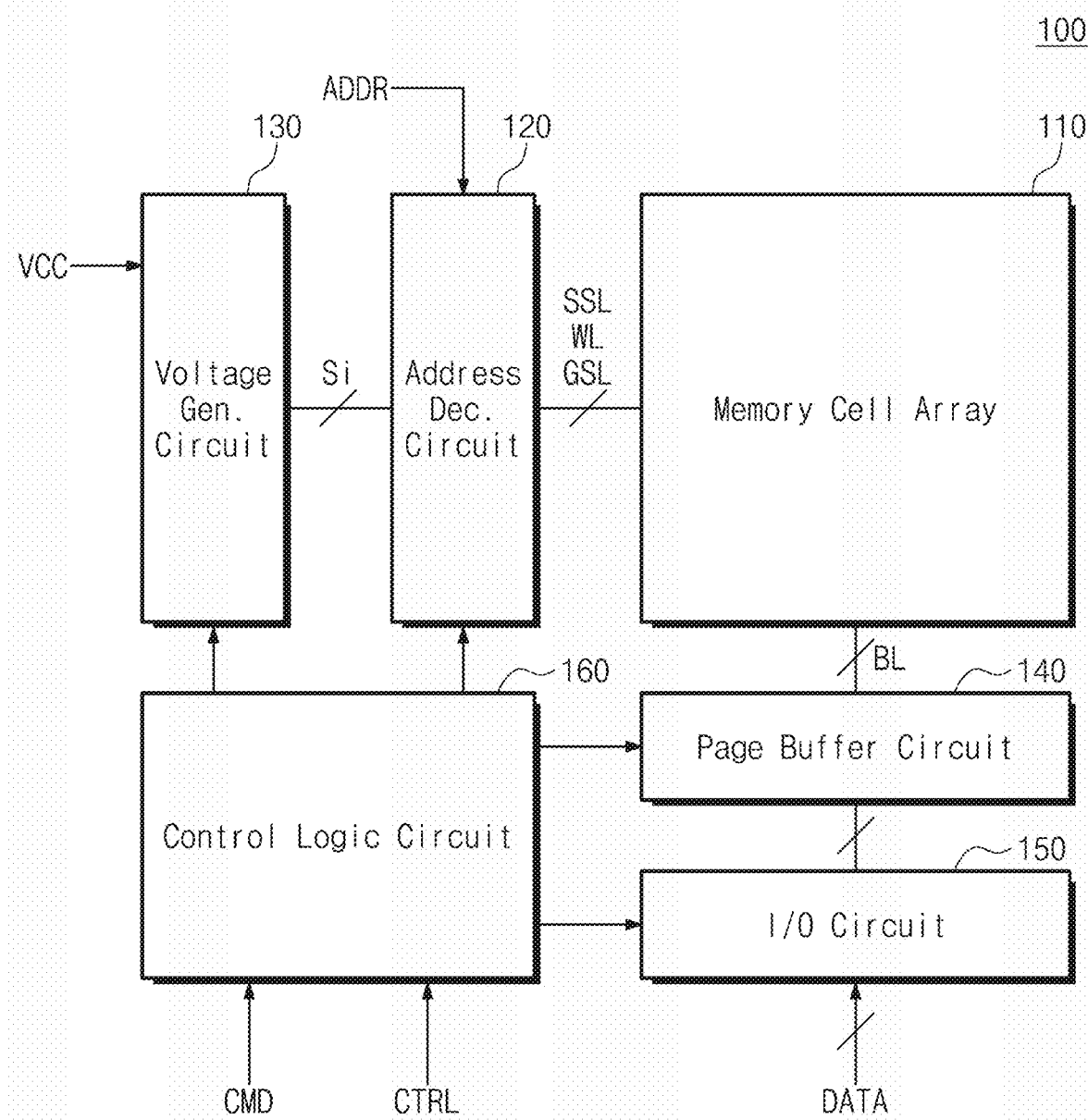
FIG. 1 is a block diagram illustrating a memory device according to an embodiment of the present disclosure.

FIG. 1 is a block diagram illustrating a memory device according to an embodiment of the present disclosure. In an embodiment, a memory device 100 may be a nonvolatile memory device that is based on a NAND flash memory. However, the present disclosure is not limited thereto. For example, the memory device 100 may be one of various types of memory devices such as a DRAM, an SRAM, a PRAM, an MRAM, an RRAM, and an FRAM.

Referring to FIG. 1, the memory device 100 may include a memory cell array 110, an address decoding circuit 120, a voltage generating circuit 130, a page buffer circuit 140, an input/output circuit 150, and a control logic circuit 160.

The memory cell array 110 may include a plurality of memory blocks. Each of the plurality of memory blocks may include a plurality of cell strings. Each of the plurality of cell strings may include a plurality of cell transistors connected in series between a bitline BL and a common source line. The plurality of cell transistors may be connected with string selection lines SSL, wordlines WL, and ground selection lines GSL. A structure of the plurality of memory blocks will be described in detail with reference to FIG. 2.

The address decoding circuit 120 may be connected with the memory cell array 110 through the string selection lines SSL, the wordlines WL, and the ground selection lines GSL. The address decoding circuit 120 may receive an address ADDR from an external device (e.g., a memory controller) and may decode the received address ADDR. The address decoding circuit 120 may control voltages of the string selection lines SSL, the wordlines WL, and the ground selection lines GSL based on a decoding result.

The voltage generating circuit 130 may generate various voltages necessary for the memory device 100 to operate. For example, the voltage generating circuit 130 may generate various voltages based on a power supply voltage VCC, such as a plurality of program voltages, a plurality of pass voltages, a plurality of verify voltages, a plurality of selection read voltages, a plurality of non-selection read voltages, a plurality of erase voltages, and a plurality of erase verify voltages.

The page buffer circuit 140 may be connected with the memory cell array 110 through bitlines BL. The page buffer circuit 140 may read data stored in the memory cell array 110 by sensing voltage changes of the bitlines BL and may temporarily store the read data. The page buffer circuit 140 may receive data from the input/output circuit 150 and may store the received data in the memory cell array 110 by controlling the bitlines BL based on the received data.

The input/output circuit 150 may exchange data "DATA" with an external device (e.g., a memory controller). For example, the input/output circuit 150 may receive the data "DATA" from the external device and may provide the received data "DATA" to the page buffer circuit 140. The input/output circuit 150 may receive the data "DATA" from the page buffer circuit 140 and may output the received data "DATA" to the external device.

The control logic circuit 160 may control an overall operation of the memory device 100. For example, the control logic circuit 160 may receive a command CMD and a control signal CTRL from an external device (e.g., a memory controller) and may control various operations (e.g., a program operation, a read operation, and an erase operation) of the memory device 100 based on the received signals.

In an embodiment, the voltage generating circuit 130 may generate various voltages in a time-division manner or may provide various voltages to driving lines Si in the time-division manner. For example, the voltages generated from the voltage generating circuit 130 may be provided to the address decoding circuit 120 through the driving lines Si. In this case, the voltages transferred through the driving lines Si may have various levels depending on an operation type.

As an example, in the case where the memory device 100 performs the read operation, a selection read voltage may be provided to a selected wordline, and non-selection read voltages may be provided to unselected wordlines. In this case, the non-selection read voltages may have various levels depending on physical locations or physical characteristics of the unselected wordlines. The voltage generating circuit 130 may generate non-selection read voltages to be provided to a plurality of unselected wordlines in the time-division manner.

For example, in the case where a voltage level of a specific unselected wordline reaches a target level, the voltage generating circuit 130 may float a driving line corresponding to the specific unselected wordline. In this case, the specific unselected wordline may be maintained at the target level; because a power (or voltage) is not additionally connected with (or supplied to) the specific unselected wordline, the whole driving power may be reduced. A wordline setup operation of the voltage generating circuit 130 according to an embodiment of the present disclosure will be described in detail with reference to the following drawings.

Below, to describe embodiments of the present disclosure easily, the embodiments of the present disclosure will be described on the basis of the read operation of the memory device 100. However, the present disclosure is not limited thereto. For example, it may be understood that the embodiments of the present disclosure may be applied to various operations (e.g., a program operation, a verify operation, and an erase operation) of the memory device 100, in which a wordline setup operation or any other operation voltages are generated.

Figure 2:
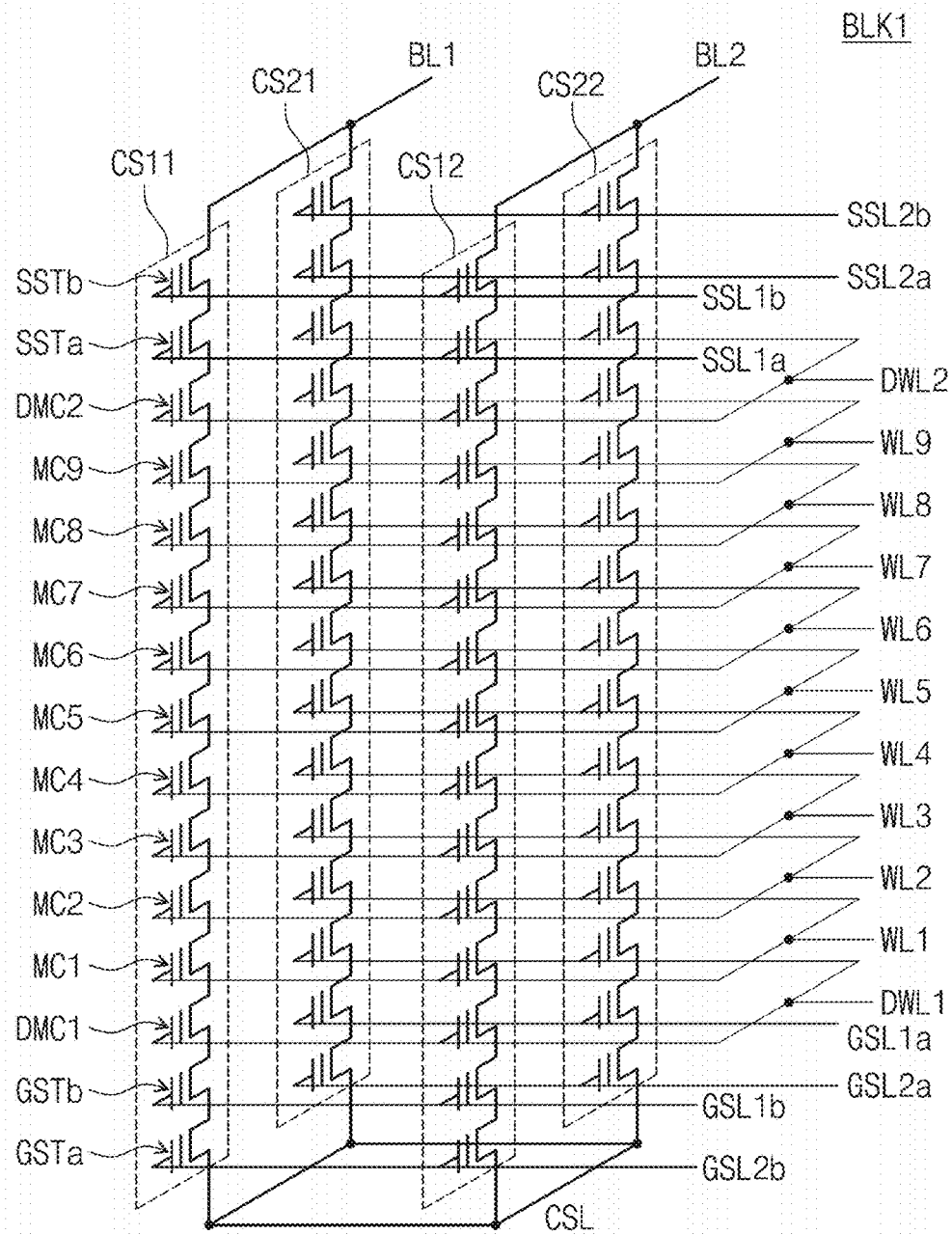
FIG. 2 is a diagram illustrating a first memory block of a plurality of memory blocks included in a memory cell array in FIG. 1.

FIG. 2 is a diagram illustrating a first memory block of a plurality of memory blocks included in a memory cell array in FIG. 1. In an embodiment, the memory device 100 of FIG. 1 may be a flash memory device that includes a plurality of memory blocks.

A memory block of a three-dimensional structure will be described with reference to FIG. 2, but the present disclosure is not limited thereto. The memory block according to the present disclosure may have a two-dimensional memory block structure. A first memory block BLK1 will be described with reference to FIG. 2, but the present disclosure is not limited thereto. The remaining memory blocks may be similar in structure to the first memory block BLK1 to be described with reference to FIG. 2.

In an embodiment, the first memory block BLK1 to be described with reference to FIG. 2 may correspond to a physical erase unit of the memory device 100. However, the present disclosure is not limited thereto. For example, an erase unit may be changed to a page unit, a wordline unit, a sub block unit, or the like.

Referring to FIG. 2, the first memory block BLK1 may include a plurality of cell strings CS11, CS12, CS21, and CS22. The plurality of cell strings CS11, CS12, CS21, and CS22 may be arranged in a row direction and a column direction to form rows and columns.

Each of the plurality of cell strings CS11, CS12, CS21, and CS22 includes a plurality of cell transistors. For example, each of the plurality of cell strings CS11, CS12, CS21, and CS22 may include string selection transistor SSTa and SSTb, a plurality of memory cells MC1 to MC9, ground selection transistors GSTa and GSTb, and dummy memory cells DMC1 and DMC2. In an embodiment, each of the plurality of cell transistors included in the cell strings CS11, CS12, CS21, and CS22 may be a charge trap flash (CTF) memory cell.

In each cell string, the plurality of memory cells MC1 to MC9 are serially connected and are stacked in a direction perpendicular to a plane defined by the row direction and the column direction, that is, in a height direction. In each cell string, the string selection transistors SSTa and SSTb are serially connected and are interposed between a bitline BL1 or BL2 and the plurality of memory cells MC1 to MC9. The ground selection transistors GSTa and GSTb are serially connected and are interposed between the plurality of memory cells MC1 to MC9 and a common source line CSL.

In an embodiment, in each cell string, the first dummy memory cell DMC1 may be interposed between the plurality of memory cells MC1 to MC9 and the ground selection transistors GSTa and GSTb. In an embodiment, the second dummy memory cell DMC2 may be interposed between the plurality of memory cells MC1 to MC9 and the string selection transistors SSTa and SSTb.

The ground selection transistors GSTa and GSTb of the cell strings CS11, CS12, CS21, and CS22 may be connected in common with a ground selection line GSL. In an embodiment, ground selection transistors in the same row may be connected with the same ground selection line, and ground selection transistors in different rows may be connected with different ground selection lines. For example, the first ground selection transistors GSTa of the cell strings CS11 and CS12 in the first row may be connected with a first ground selection line, and the first ground selection transistors GSTa of the cell strings CS21 and CS22 in the second row may be connected with a second ground selection line.

In an embodiment, although not illustrated, ground selection transistors provided at the same height from a substrate (not illustrated) may be connected with the same ground selection line, and ground selection transistors provided at different heights therefrom may be connected with different ground selection lines.

Memory cells of the same height from the substrate or the ground selection transistors GSTa and GSTb are connected in common with the same wordline, and memory cells of different heights therefrom are connected with different wordlines. For example, the first to ninth memory cells MC1 to MC9 of the cell strings CS11, CS12, CS21, and CS22 may be connected with first to ninth wordlines WL1 to WL9.

String selection transistors, which belong to the same row, from among the first string selection transistors SSTa of the same height are connected with the same string selection line, and string selection transistors belonging to different rows are connected with different string selection lines. For example, the first string selection transistors SSTa of the cell strings CS11 and CS12 in the first row may be connected in common with a string selection line SSL1a, and the first string selection transistors SSTa of the cell strings CS21 and CS22 in the second row may be connected in common with a string selection line SSL2a.

Likewise, second string selection transistors, which belong to the same row, from among the second string selection transistors SSTb at the same height are connected with the same string selection line, and second string selection transistors in different rows are connected with different string selection lines. For example, the second string selection transistors SSTb of the cell strings CS11 and CS12 in the first row are connected in common with a string selection line SSL1b, and the second string selection transistors SSTb of the cell strings CS21 and CS22 in the second row may be connected in common with a string selection line SSL2b.

In an embodiment, dummy memory cells of the same height are connected with the same dummy wordline, and dummy memory cells of different heights are connected with different dummy wordlines. For example, the first dummy memory cells DMC1 are connected with a first dummy wordline DWL1, and the second dummy memory cells DMC2 are connected with a second dummy wordline DWL2.

In an embodiment, the first memory block BLK1 illustrated in FIG. 2 is only an example. The number of cell strings may increase or decrease, and the number of rows of cell strings and the number of columns of cell strings may increase or decrease depending on the number of cell strings. Also, the number of cell transistors (e.g., GST, MC, DMC, and SST) of the first memory block BLK1 may increase or decrease, and the height of the first memory block BLK1 may increase or decrease depending on the number of cell transistors. Also, the number of lines (e.g., GSL, WL, DWL, and SSL) connected with cell transistors may increase or decrease depending on the number of cell transistors.

Figure 3:
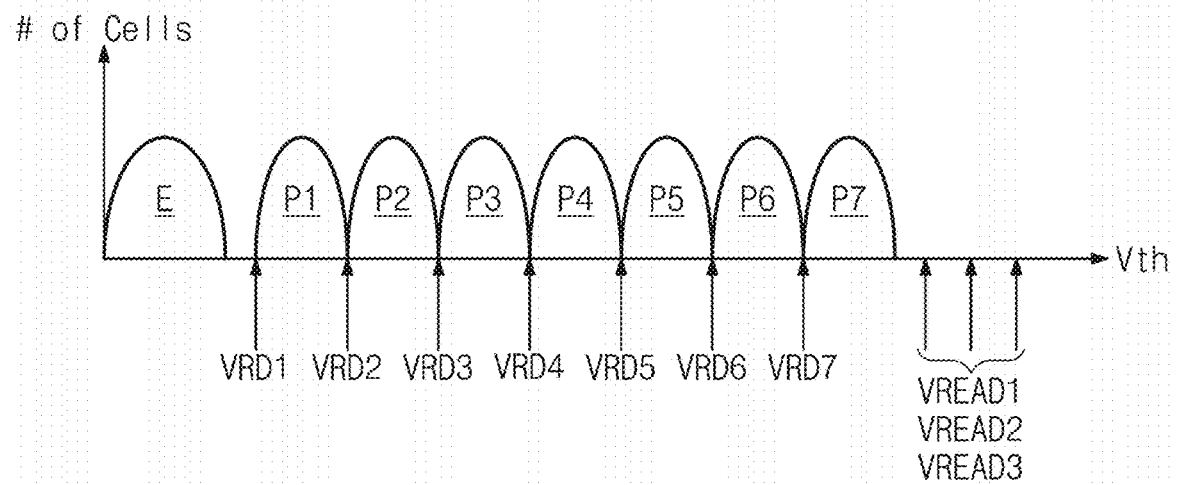
FIG. 3 is a diagram illustrating threshold voltage distributions of memory cells of FIG. 2.

FIG. 3 is a diagram illustrating threshold voltage distributions of memory cells of FIG. 2. Below, to describe embodiments of the present disclosure easily, it is assumed that each of the memory cells of the memory device 100 is a triple level cell (TLC) configured to store 3-bit data. However, the present disclosure is not limited thereto. For example, each memory cell may be a single level cell (SLC) storing 1-bit data, or a multi-level cell (MLC), a triple level cell (TLC), or a quad level cell (QLC) storing n-bit data (n being a natural number more than 1).

Referring to FIGS. 2 and 3, each memory cell may be programmed to have one of an erase state "E" and first to seventh program states P1 to P7. To read data programmed in the memory cells, the memory device 100 may use a plurality of selection read voltages VRD1 to VRD7 and a plurality of non-selection read voltages VREAD1 to VREAD3. For example, to read data programmed in memory cells connected with a selected wordline, the memory device 100 may sequentially apply the plurality of selection read voltages VRD1 to VRD7 to the selected wordline and may apply the plurality of non-selection read voltages VREAD1 to VREAD3 to unselected wordlines.

In an embodiment, the plurality of selection read voltages VRD1 to VRD7 may have voltage levels for distinguishing the erase state "E" and the first to seventh program states P1 to P7. The plurality of non-selection read voltages VREAD1 to VREAD3 may have voltage levels higher than the first to seventh program states P1 to P7. That is, memory cells connected with an unselected wordline to which the plurality of non-selection read voltages VREAD1 to VREAD3 are applied may become a turn-on state. In an embodiment, a level of a non-selection read voltage necessary for each wordline may be variable depending on physical characteristics of memory cells or physical locations of memory cells. That is, the plurality of non-selection read voltages VREAD1 to VREAD3 may have different levels.

A plurality of voltage sources or a plurality of voltage generators may be required to generate the plurality of non-selection read voltages VREAD1 to VREAD3. In this case, the area or power consumption of the memory device 100 may increase due to the plurality of voltage sources or the plurality of voltage generators. In contrast, the memory device 100 according to the present disclosure may generate a plurality of non-selection read voltages in the time-division manner by using voltage sources or voltage generators, the number of which is relatively small. In this case, the area and power consumption of the memory device 100 may be reduced.

In an embodiment, to describe embodiments of the present disclosure easily, three non-selection read voltages VREAD1 to VREAD3 are illustrated, but the present disclosure is not limited thereto. For example, the number of non-selection read voltages (e.g., the number of different levels) may be variously changed or modified.

Figure 4:
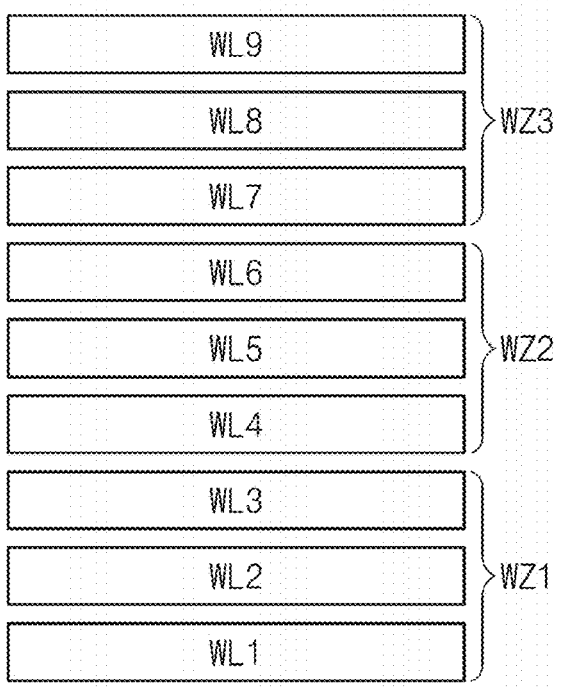
FIG. 4 is a diagram for describing wordlines included in a first memory block of FIG. 2.
Figure 5:
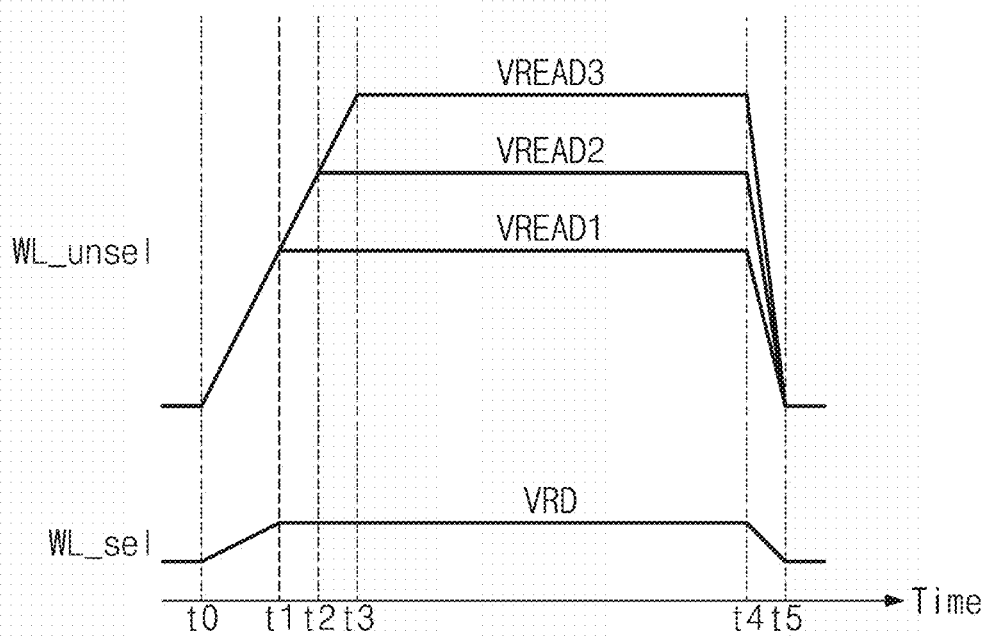
FIG. 5 is a diagram for describing a read operation associated with a first memory block of FIG. 2.

FIG. 4 is a diagram for describing wordlines included in a first memory block of FIG. 2. FIG. 5 is a diagram for describing a read operation associated with a first memory block of FIG. 2. Referring to FIGS. 2 to 5, the first memory block BLK1 may include the first to ninth wordlines WL1 to WL9. The first to ninth wordlines WL1 to WL9 may be divided into a plurality of wordline zones WZ1, WZ2, and WZ3. In an embodiment, the first wordline zone WZ1 may include the first to third wordlines WL1 to WL3, the second wordline zone WZ2 may include the fourth to sixth wordlines WL4 to WL6, and the third wordline zone WZ3 may include the seventh to ninth wordlines WL7 to WL9.

In the read operation of the memory device 100, unselected wordlines may be controlled in units of wordline zone. For example, as illustrated in FIG. 5, in the read operation of the memory device 100, the memory device 100 may apply a selection read voltage VRD (e.g., one of the selection read voltages VRD1 to VRD7 of FIG. 3) to a selected wordline WL_sel and may apply the non-selection read voltages VREAD1 to VREAD3 to unselected wordlines WL_unsel. In this case, the first non-selection read voltage VREAD1 may be applied to unselected wordlines WL_unsel included in the first wordline zone WZ1, the second non-selection read voltage VREAD2 may be applied to unselected wordlines WL_unsel included in the second wordline zone WZ2, and the third non-selection read voltage VREAD3 may be applied to unselected wordlines WL_unsel included in the third wordline zone WZ3. That is, a level of a non-selection read voltage to be applied to an unselected wordline may change depending on a physical location or a wordline zone of the unselected wordline.

In an embodiment, the first memory block BLK1, the first to ninth wordlines WL1 to WL9, the first to third wordline zones WZ1 to WZ3, the selection read voltage VRD, and the number of non-selection read voltages VREAD1 to VREAD3 described with reference to FIGS. 4 and 5 are only an example for describing an embodiment of the present disclosure, and the present disclosure is not limited thereto.

Figure 6:
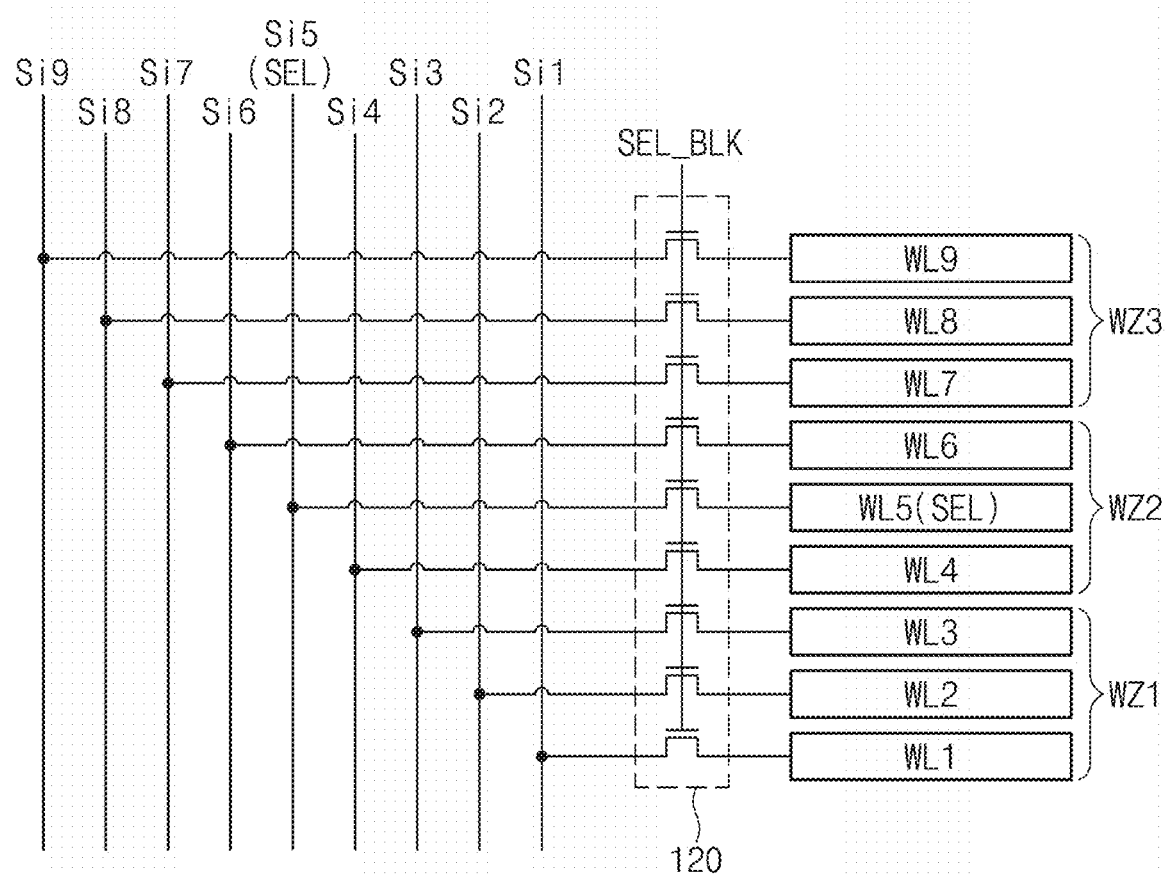
FIG. 6 is a diagram for describing a structure of an address decoding circuit and driving lines of a memory device of FIG. 1.

FIG. 6 is a diagram for describing a structure of an address decoding circuit and driving lines of a memory device of FIG. 1. For convenience of description, unnecessary components are omitted. Below, for convenience of description, it is assumed that the fifth wordline WL5 is a selected wordline for the read operation. In this case, a selection read voltage may be provided to the fifth wordline WL5, and corresponding non-selection read voltages may be provided to the remaining wordlines WL1 to WL4 and WL6 to WL9 (e.g., unselected wordlines).

For example, referring to FIGS. 1 and 6, first to ninth driving lines Si1 to Si9 may correspond to the first to ninth wordlines WL1 to WL9, respectively. In the case where the fifth wordline WL5 is a selected wordline, the selection read voltage VRD may be provided to the fifth driving line Si5, and the non-selection read voltages may be provided to the remaining driving lines Si1 to Si4 and Si6 to Si9.

The address decoding circuit 120 may generate a block selection signal SEL_BLK based on a result of decoding the received address ADDR. The address decoding circuit 120 may respectively connect the first to ninth driving lines Si1 to Si9 with the first to ninth wordlines WL1 to WL9 in response to the block selection signal SEL_BLK. In other words, the address decoding circuit 120 may respectively provide voltages transferred through the first to ninth driving lines Si1 to Si9 to the first to ninth wordlines WL1 to WL9 in response to the block selection signal SEL_BLK.

Figure 7A:
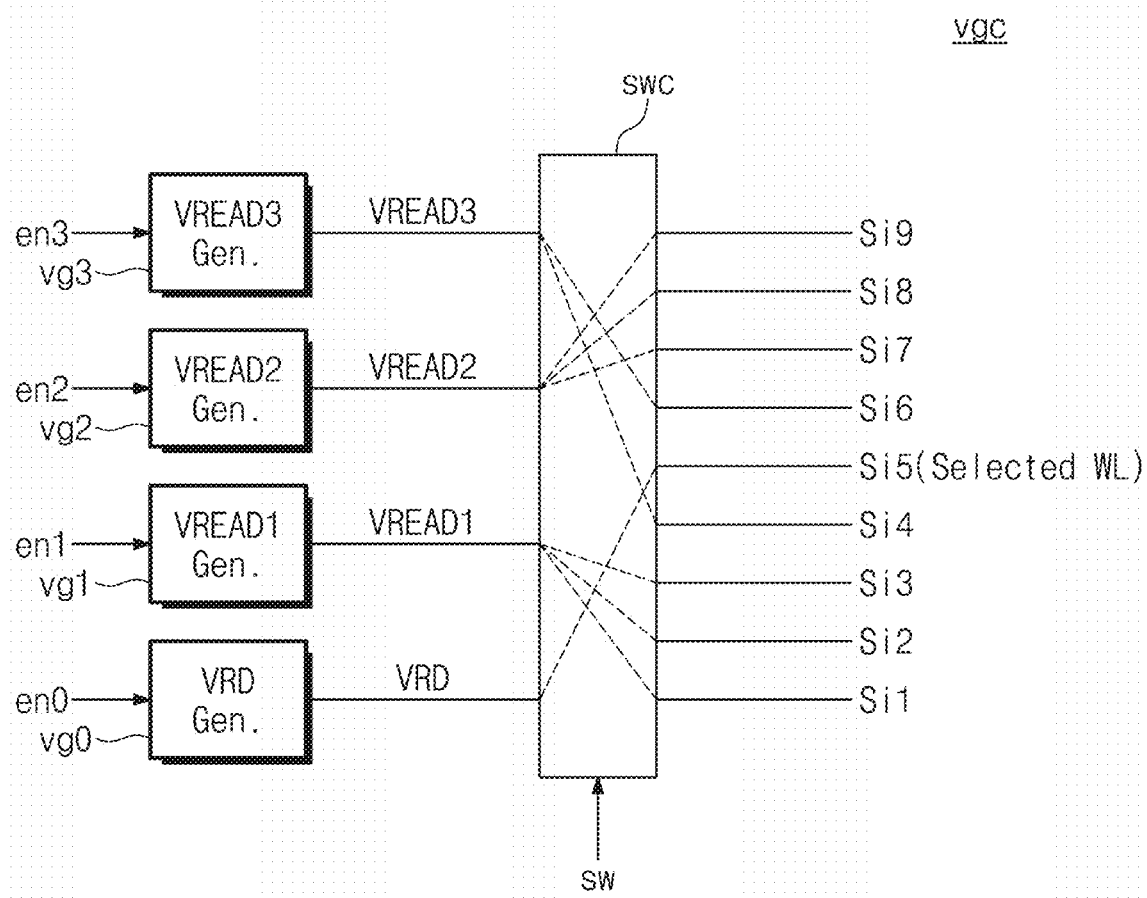
FIG. 7A is a diagram illustrating a voltage generating circuit of a memory device.

FIG. 7A is a diagram illustrating a voltage generating circuit of a memory device. FIG. 7B is a timing diagram for describing an operation of a voltage generating circuit of FIG. 7A. Referring to FIGS. 6, 7A, and 7B, a voltage generating circuit vgc may include a plurality of voltage generators vg0 to vg3 and a switch circuit swc. The plurality of voltage generators vg0 to vg3 may generate the selection read voltage VRD and the plurality of non-selection read voltages VREAD1 to VREAD3, respectively.

The switch circuit swc may provide or connect the voltages generated from the plurality of voltage generators vg0 to vg3 to or with corresponding driving lines in response to a switching signal sw, respectively. For example, in the case where the fifth wordline WL5 is a selected wordline, the selection read voltage VRD may be provided to the fifth wordline WL5, and the non-selection read voltages VREAD1, VREAD2, and VREAD3 may be provided to the remaining wordlines WL1 to WL4 and WL6 to WL9. In this case, the switch circuit swc may perform a switching operation in response to the switching signal sw such that the selection read voltage VRD from the 0-th voltage generator vg0 is provided to the fifth driving line Si5, the first non-selection read voltage VREAD1 from the first voltage generator vg1 is provided to the first to third driving lines Si1 to Si3, the second non-selection read voltage VREAD2 from the second voltage generator vg2 is provided to the seventh to ninth driving lines Si7 to Si9, and the third non-selection read voltage VREAD3 from the third voltage generator vg3 is provided to the fourth and sixth driving lines Si4 and Si6.

In detail, as illustrated in FIG. 7B, at a 0-th point in time t0, the memory device 100 may start a wordline setup operation. For example, the 0-th voltage generator vg0 may increase a voltage of the fifth driving line Si5 corresponding to the selected wordline WL_sel to the selection read voltage VRD during a time period from the 0-th point in time t0 to a first point in time t1 and may maintain the voltage of the fifth driving line Si5 at the selection read voltage VRD during a time period from the first point in time t1 to a fourth point in time t4.

The first voltage generator vg1 may increase voltages of the first to third driving lines Si1 to Si3 corresponding to the unselected wordlines WL_unsel (e.g., WL1, WL2, and WL3) to the first non-selection read voltage VREAD1 during the time period from the 0-th point in time t0 to the first point in time t1 and may maintain the voltages of the first to third driving lines Si1 to Si3 at the first non-selection read voltage VREAD1 during the time period from the first point in time t1 to the fourth point in time t4.

The second voltage generator vg2 may increase voltages of the seventh to ninth driving lines Si7 to Si9 corresponding to the unselected wordlines WL_unsel (e.g., WL7, WL8, and WL9) to the second non-selection read voltage VREAD2 during the time period from the 0-th point in time t0 to a second point in time t2 and may maintain the voltages of the seventh to ninth driving lines Si7 to Si9 at the second non-selection read voltage VREAD2 during the time period from the second point in time t2 to the fourth point in time t4.

The third voltage generator vg3 may increase voltages of the fourth and sixth driving lines Si4 and Si6 corresponding to the unselected wordlines WL_unsel (e.g., WL4 and WL6) to the third non-selection read voltage VREAD3 during the time period from the 0-th point in time t0 to a third point in time t3 and may maintain the voltages of the fourth and sixth driving lines Si4 and Si6 at the third non-selection read voltage VREAD3 during the time period from the third point in time t3 to the fourth point in time t4.

After the wordline setup operation for the plurality of wordlines WL1 to WL9 is completed, the memory device 100 may perform a sensing operation during a time period from the third point in time t3 to the fourth point in time t4. After the sensing operation is completed, the memory device 100 may perform a recovery operation (that is, an operation of discharging wordline voltages) during a time period from the fourth point in time t4 to a fifth point in time t5.

In an embodiment, the 0-th to third voltage generators vg0 to vg3 may operate in response to 0-th to third enable signals en0 to en3, respectively. In this case, while the wordlines WL1 to WL9 are driven (e.g., during a wordline setup period and a wordline develop period), the 0-th to third enable signals en0 to en3 may maintain an on state (e.g., an enable state). Likewise, while the wordlines WL1 to WL9 are driven (e.g., during the wordline setup period and the wordline develop period), the switching signal sw that allows the switch circuit swc to connect the 0-th to third voltage generators vg0 to vg3 and the plurality of driving lines Si1 to Si9 may maintain the on state or the enable signal.

In the embodiment described with reference to FIGS. 7A and 7B, the first to third voltage generators vg1 to vg3 (e.g., three voltage generators) are used to generate the first to third non-selection read voltages VREAD1 to VREAD3 to be applied to unselected wordlines. In this case, because voltage generators, the number of which is the same as the number of non-selection read voltages, are required, the area of the memory device 100 may increase. Also, while the wordlines WL1 to WL9 are driven (e.g., during the wordline setup period and the wordline develop period), because the enable signals en0 to en3 for controlling the voltage generators vg0 to vg3 and the switching signal sw maintain the enable signal, the power consumption of the memory device 100 may increase.

Figure 8A:
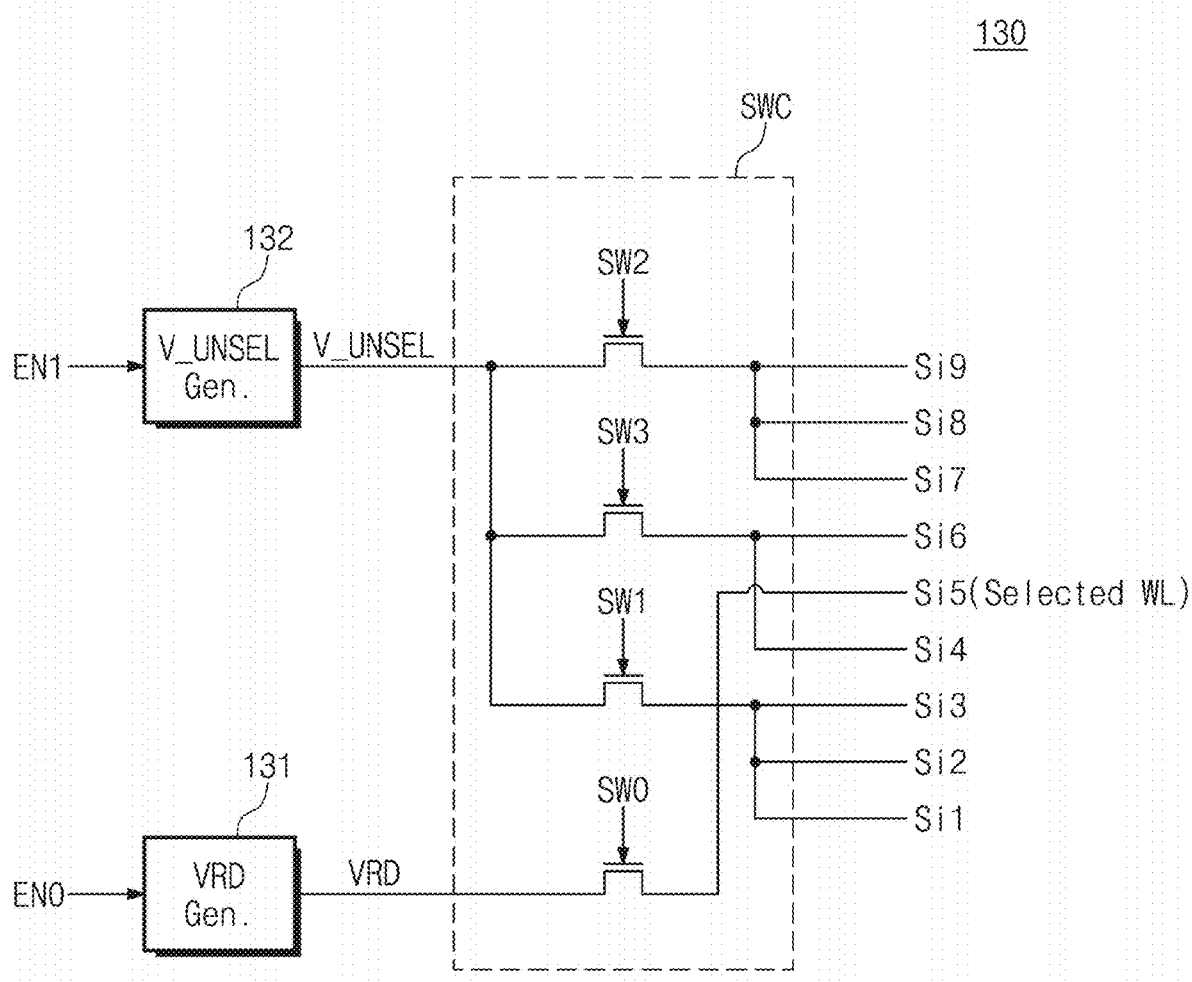
FIG. 8A is a block diagram illustrating a voltage generating circuit included in a memory device of FIG. 1.

FIG. 8A is a block diagram illustrating a voltage generating circuit included in a memory device of FIG. 1. FIG. 8B is a timing diagram for describing an operation of a voltage generating circuit of FIG. 8A. Referring to FIGS. 1, 8A, and 8B, the voltage generating circuit 130 may include a selection read voltage generator 131, a non-selection voltage generator 132, and the switch circuit SWC.

The selection read voltage generator 131 may generate the selection read voltage VRD in response to a 0-th enable signal EN0. The non-selection voltage generator 132 may generate a non-selection voltage V_UNSEL in response to a first enable signal EN1. In an embodiment, the non-selection voltage V_UNSEL may be higher or equal to a non-selection read voltage (e.g., VREAD3) having the highest level from among the plurality of non-selection read voltages VREAD1 to VREAD3 described above.

In an embodiment, it is assumed that the fifth wordline WL5 of the plurality of wordlines WL1 to WL9 is a selected wordline. In this case, the selection read voltage VRD may be applied to the fifth driving line Si5 corresponding to the fifth wordline WL5, and the non-selection read voltages VREAD1 to VREAD3 may be provided to the remaining driving lines Si1 to Si4 and Si6 to Si9 corresponding to the remaining wordlines WL1 to WL4 and WL6 to WL9.

The above operation may be performed through the switch circuit SWC of the voltage generating circuit 130. For example, the switch circuit SWC may provide the fifth driving line Si5 with the selection read voltage VRD generated from the selection read voltage generator 131 in response to a 0-th switching signal SW0. The switch circuit SWC may provide the first to third driving lines Si1 to Si3 with the non-selection voltage V_UNSEL generated from the non-selection voltage generator 132 in response to a first switching signal SW1, may provide the seventh to ninth driving lines Si7 to Si9 with the non-selection voltage V_UNSEL in response to a second switching signal SW2, and may provide the fourth and sixth driving lines Si4 and Si6 with the non-selection voltage V_UNSEL in response to a third switching signal SW3.

In this case, the first to third driving lines Si1 to Si3 may be driven with the first non-selection read voltage VREAD1, the seventh to ninth driving lines Si7 to Si9 may be driven with the second non-selection read voltage VREAD2, and the fourth and sixth driving lines Si4 and Si6 may be driven with the third non-selection read voltage VREAD3. To this end, the first to third switching signals SW1 to SW3 may be generated in the time-division manner.

For example, as illustrated in FIG. 8B, at a 0-th point in time t0, the memory device 100 may start the wordline setup operation for the read operation. During a time period from the 0-th point in time t0 to a first point in time t1, the 0-th enable signal EN0 and the 0-th switching signal SW0 may be at an on-state (e.g., may be enabled). The selection read voltage VRD generated from the selection read voltage generator 131 may be provided to the selected wordline WL_sel in response to the 0-th enable signal EN0 and the 0-th switching signal SW0. In an embodiment, in the case where the selected wordline WL_sel reaches a target level (e.g., a level of the selection read voltage VRD), the 0-th enable signal EN0 and the 0-th switching signal SW0 may be at an off-state (e.g., may be disabled).

In an embodiment, even though the selected wordline WL_sel reaches the target level (e.g., the level of the selection read voltage VRD), the 0-th enable signal EN0 and the 0-th switching signal SW0 may maintain the on-state (e.g., may be enabled) for the reliability of the read operation.

Unlike the embodiment of FIGS. 7A and 7B, in the embodiment of FIGS. 8A and 8B, one non-selection voltage generator 132 may provide the non-selection read voltages VREAD1 to VREAD3 to a plurality of driving lines (e.g., Si1 to Si4 and Si6 to Si9) corresponding to the unselected wordlines WL_unsel.

For example, during the time period from the 0-th point in time t0 to the first point in time t1, the first to third switching signals SW1 to SW3 may be at the on-state (e.g., may be enabled). During the time period from the 0-th point in time t0 to the first point in time t1, the switch circuit SWC may connect an output of the non-selection voltage generator 132 with the driving lines Si1 to Si4 and Si6 to Si9 corresponding to the unselected wordlines WL_unsel in response to the first to third switching signals SW1 to SW3.

At the first point in time t1, the output of the non-selection voltage generator 132 may reach the first non-selection read voltage VREAD1. In this case, the first to third wordlines WL1 to WL3 of the first wordline zone WZ1 in which the first non-selection read voltage VREAD1 is defined as a target level may be set up to the target level, that is, the first non-selection read voltage VREAD1. In this case, at the first point in time t1, the memory device 100 may change the first switching signal SW1 to the off-state (e.g., the disabled state) such that driving lines (e.g., Si1 to Si3) corresponding to wordlines (e.g., WL1 to WL3) reaching the target level are floated. In other words, at the first point in time t1, because the first to third driving lines Si1 to Si3 are floated by the first switching signal SW1, the first to third wordlines WL1 to WL3 corresponding thereto may be at a floating state and may maintain the level of the first non-selection read voltage VREAD1.

Likewise, at the second point in time t2, the output of the non-selection voltage generator 132 may reach the second non-selection read voltage VREAD2. In this case, the seventh to ninth wordlines WL7 to WL9 of the third wordline zone WZ3 in which the second non-selection read voltage VREAD2 is defined as a target level may be set up to the target level, that is, the second non-selection read voltage VREAD2. In this case, at the second point in time t2, the memory device 100 may change the second switching signal SW2 to the off-state (e.g., the disabled state) such that driving lines (e.g., Si7 to Si9) corresponding to wordlines (e.g., WL7 to WL9) reaching the target level are floated.

Likewise, at a third point in time t3, the output of the non-selection voltage generator 132 may reach the third non-selection read voltage VREAD3. In this case, the fourth and sixth wordlines WL4 and WL6 of the second wordline zone WZ2 in which the third non-selection read voltage VREAD3 is defined as a target level may be set up to the target level, that is, the third non-selection read voltage VREAD3. In this case, at the third point in time t3, the memory device 100 may change the third switching signal SW3 to the off-state (e.g., the disabled state) such that driving lines (e.g., Si4 and Si6) corresponding to wordlines (e.g., WL4 and WL6) reaching the target level are floated.

In an embodiment, at the third point in time t3, all the unselected wordlines WL_unsel may be set up to the corresponding target levels. In this case, the memory device 100 may change a state of the first enable signal EN1 to the disabled state such that the non-selection voltage generator 132 is disabled.

FIGS. 9A to 9D are diagrams for describing operations of a voltage generating circuit according to the timing diagram of FIG. 8B. Referring to FIGS. 1 and 8A to 9D, the voltage generating circuit 130 may include the selection read voltage generator 131, the non-selection voltage generator 132, and the switch circuit SWC. The selection read voltage generator 131 may generate the selection read voltage VRD in response to the 0-th enable signal EN0, and the non-selection voltage generator 132 may generate the non-selection voltage V_UNSEL in response to the first enable signal EN1. The switch circuit SWC may selectively provide the selection read voltage VRD and the non-selection voltage V_UNSEL to the plurality of driving lines Si1 to Si9 in response to the plurality of switching signals SW0 to SW3.

Figure 9A:
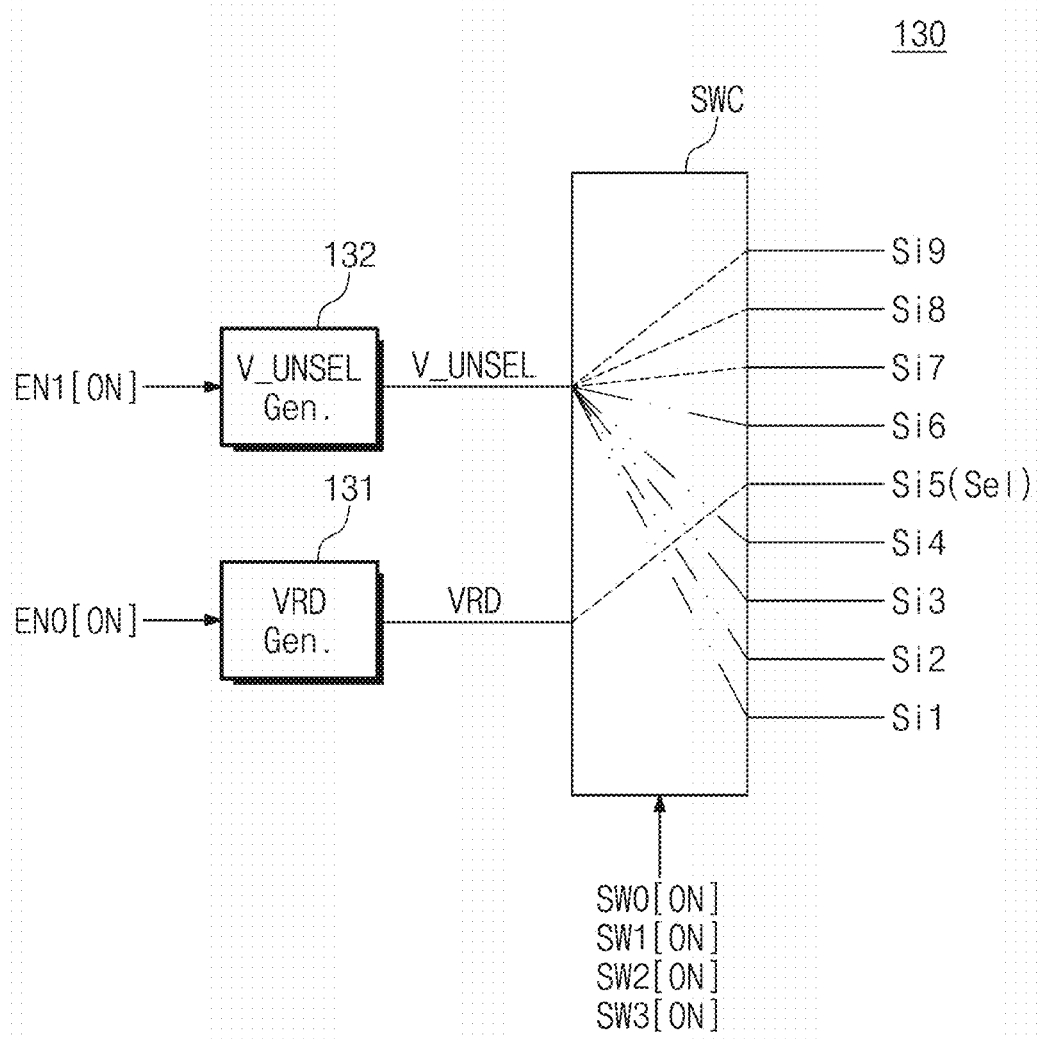
FIGS. 9A to 9D are diagrams for describing operations of a voltage generating circuit according to the timing diagram of FIG. 8B.

FIG. 9A shows the operation of the voltage generating circuit 130 during the time period from t0 to t1 of FIG. 8A. As illustrated in FIG. 9A, during the time period from t0 to t1, the selection read voltage generator 131 starts to output the selection read voltage VRD in response to the 0-th enable signal EN0 of an on-state ON, and the non-selection voltage generator 132 starts to output the non-selection voltage V_UNSEL in response to the first enable signal EN1 of the on-state ON. In response to the 0-th to third switching signals SW0 to SW3 of the on-state ON, the switch circuit SWC provides the selection read voltage VRD to the fifth driving line Si5 and may provide the non-selection voltage V_UNSEL to the first to fourth and sixth to ninth driving lines Si1 to Si4 and Si6 to Si9.

Figure 9B:
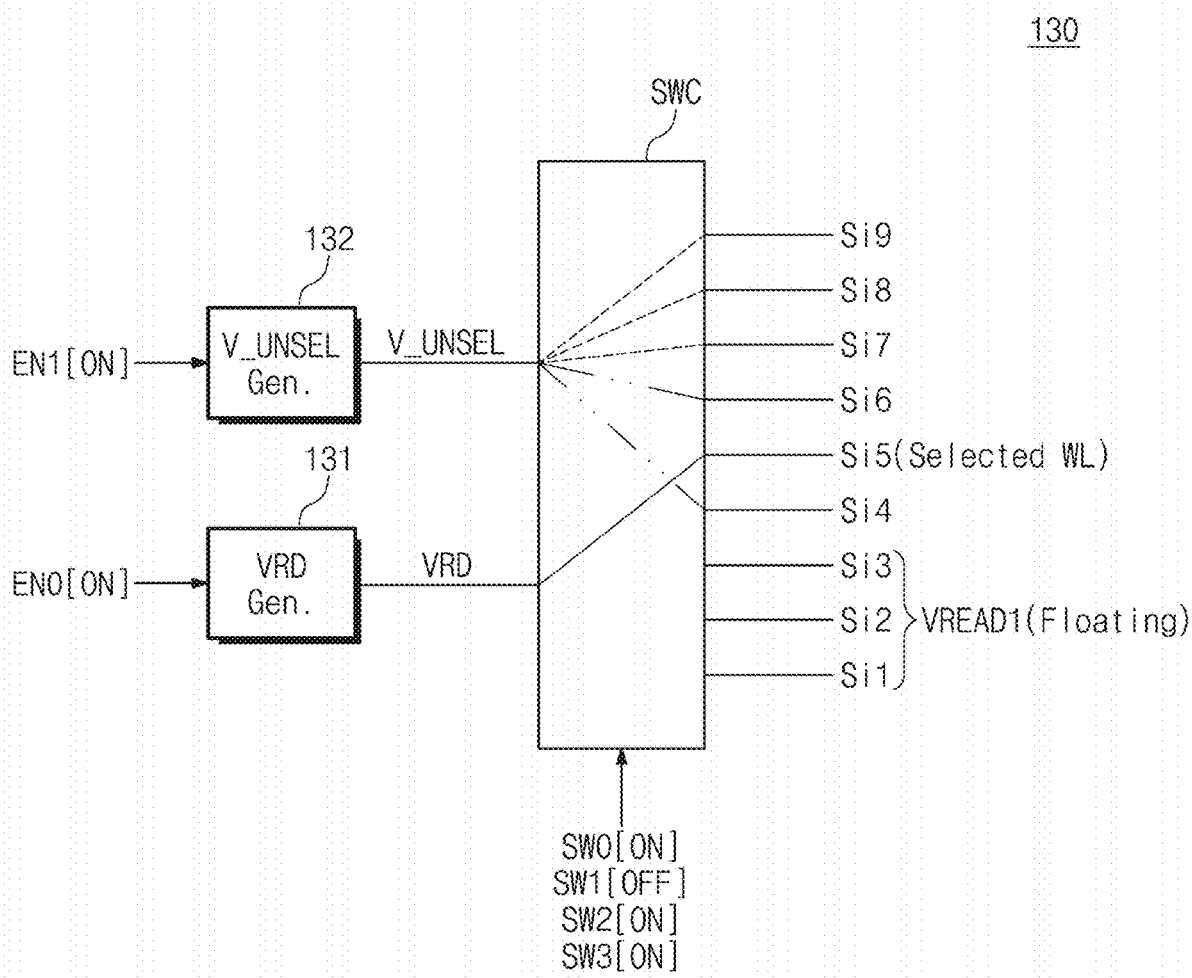

FIG. 9B shows the operation of the voltage generating circuit 130 during the time period from t1 to t2 of FIG. 8A. As described above, at the first point in time t1, the output of the non-selection voltage generator 132 may reach the first non-selection read voltage VREAD1. In this case, the first switching signal SW1 may switch to an off-state OFF. The switch circuit SWC may disconnect the output of the non-selection voltage generator 132 from the first to third driving lines Si1 to Si3 in response to the first switching signal SW1 of the off-state OFF. In this case, the first to third driving lines Si1 to Si3 may be at the floating state and may maintain the first non-selection read voltage VREAD1 being the target level thereof.

Figure 9C:
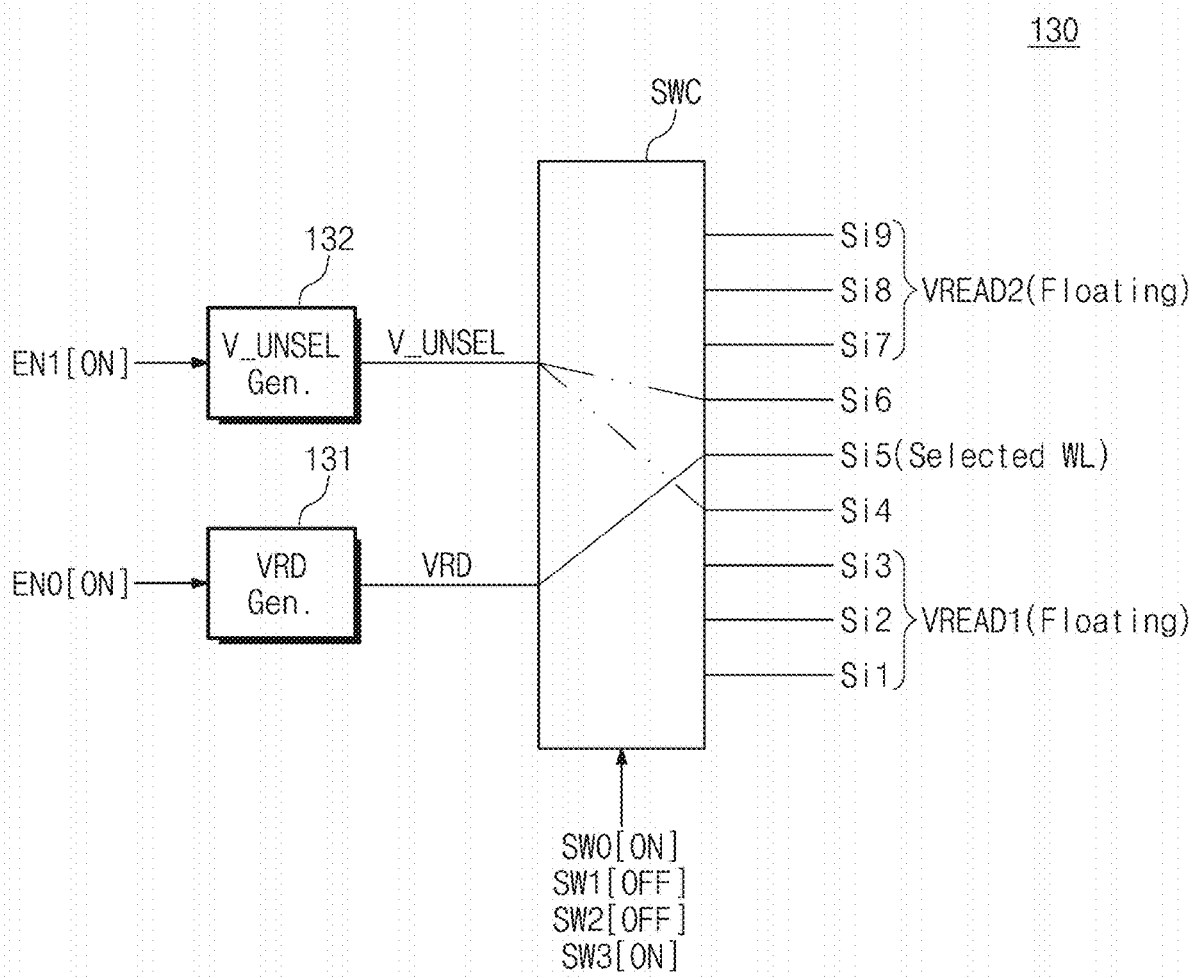

FIG. 9C shows the operation of the voltage generating circuit 130 during the time period from t2 to t3 of FIG. 8A. As described above, at the second point in time t2, the output of the non-selection voltage generator 132 may reach the second non-selection read voltage VREAD2. In this case, the second switching signal SW2 may switch to the off-state OFF. The switch circuit SWC may disconnect the output of the non-selection voltage generator 132 from the seventh to ninth driving lines Si7 to Si9 in response to the second switching signal SW2 of the off-state OFF. In this case, the seventh to ninth driving lines Si7 to Si9 may be at the floating state and may maintain the second non-selection read voltage VREAD2 being the target level thereof.

Figure 9D:
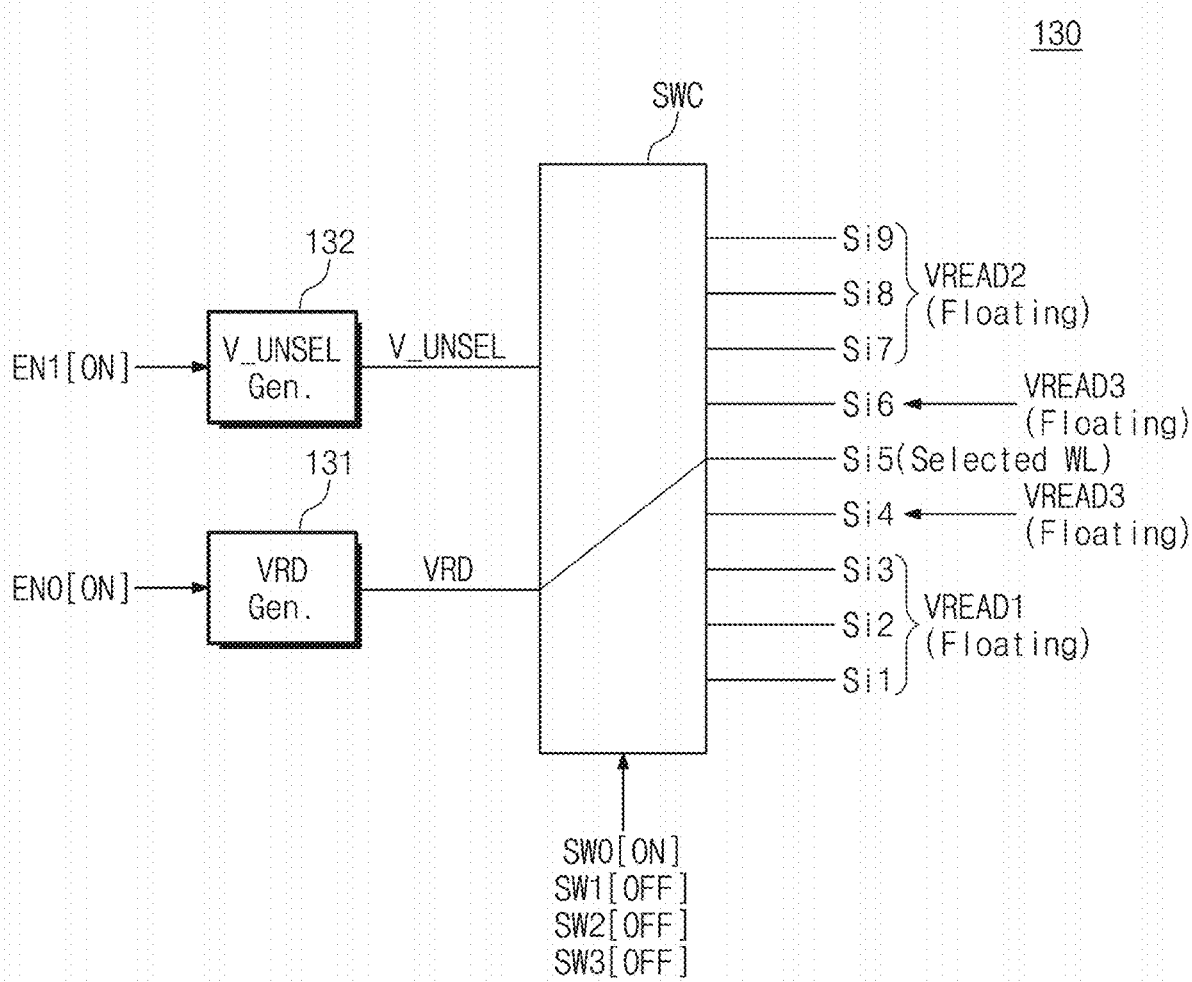

FIG. 9D shows the operation of the voltage generating circuit 130 during the time period from t3 to t4 of FIG. 8A. As described above, at the third point in time t3, the output of the non-selection voltage generator 132 may reach the third non-selection read voltage VREAD3. In this case, the third switching signal SW3 may switch to the off-state OFF. The switch circuit SWC may disconnect the output of the non-selection voltage generator 132 from the fourth and sixth driving lines Si4 and Si6 in response to the third switching signal SW3 of the off-state OFF. In this case, the fourth and sixth driving lines Si4 and Si6 may be at the floating state and may maintain the third non-selection read voltage VREAD3 being the target level thereof.

In an embodiment, in the diagrams of FIGS. 9A to 9D, the 0-th enable signal EN0 and the 0-th switching signal SW0 are illustrated as maintaining the on-state ON, but the present disclosure is not limited thereto. For example, as illustrated in FIG. 8B, in the case where a selected wordline is set up to the selection read voltage VRD, the selection read voltage generator 131 may be disabled, or a driving line corresponding to the selected wordline may be floated (or disconnected) from the output of the selection read voltage generator 131.

As described above, according to an embodiment of the present disclosure, in the read operation, the memory device 100 may apply a plurality of non-selection read voltages to unselected wordlines. In this case, the plurality of non-selection read voltages may be generated in the time-division manner by using voltage generators, the number of which is less than the number of non-selection read voltages (e.g., by using the non-selection voltage generator 132). Accordingly, the area of the memory device 100 may be reduced. Also, after the unselected wordlines are set up, because the unselected wordlines are floated and the non-selection voltage generator 132 is disabled, power consumption of the memory device 100 may be reduced.

To describe embodiments of the present disclosure easily, the above embodiments are described on the basis of the configuration in which a selected wordline is the fifth wordline WL5. That is, in the above embodiments, a driving line corresponding to the selected wordline is the fifth driving line Si5, and a structure and an operation of the switch circuit SWC are described under the condition. However, the present disclosure is not limited thereto. For example, it may be understood that the switch circuit SWC performs a switching operation depending on a physical location or address of a selected wordline such that a selection read voltage is provided to a driving line corresponding to the selected wordline and a non-selection voltage is provided to the remaining unselected wordlines and various switching signals for the switching operation are generated.

In the above embodiments, various enable signals and various switching signals may be generated or controlled by the control logic circuit 160 of the memory device 100. The control logic circuit 160 may include a function block configured to control the various enable signals and the various switching signals. In an embodiment, the control logic circuit 160 may generate or control the various enable signals and the various switching signals depending on whether voltages of a plurality of wordlines reaches a target level(s). Alternatively, the control logic circuit 160 may generate or control the various enable signals and the various switching signals depending on whether the output of the non-selection voltage generator 132 reaches a specific level (e.g., the non-selection read voltage VREAD1, VREAD2, or VREAD3).

FIG. 10A is a block diagram illustrating a voltage generating circuit of FIG. 1. FIG. 10B is a timing diagram for describing an operation of a voltage generating circuit of FIG. 10A. To describe an embodiment of the present disclosure easily, components such as a selected wordline and a selection read voltage are omitted in FIGS. 10A and 10B. However, the present disclosure is not limited thereto.

Referring to FIGS. 1 and 10A, a voltage generating circuit 130a may include a plurality of voltage generators 131a to 13na. The plurality of voltage generators 131a to 13na may generate a plurality of non-selection read voltages VREAD1 to VREADn in response to a plurality of enable signals EN1 to ENn, respectively.

The voltage generating circuit 130a may provide an output (e.g., VREAD1) of the first voltage generator 131a to a-th driving lines Si_a corresponding to wordlines of an a-th wordline zone WZa in response to a first switching signal SW1. The voltage generating circuit 130a may provide an output (e.g., VREAD2) of the second voltage generator 132a to b-th driving lines Si_b corresponding to wordlines of a b-th wordline zone WZb in response to a second switching signal SW2. The voltage generating circuit 130a may provide an output (e.g., VREADn) of the n-th voltage generator 13na to n-th driving lines Si_n corresponding to wordlines of an n-th wordline zone WZn in response to an n-th switching signal SWn.

In an embodiment, the first to n-th switching signals SW1 to SWn may be controlled in the time-division manner. For example, as illustrated in FIG. 10B, at a 0-th point in time t0, the memory device 100 may start the wordline setup operation. In this case, at a 0-th point in time t0, first to n-th switching signals SW1 to SWn and the first to n-th enable signals EN1 to ENn may transition to the on-state. As such, the voltage generating circuit 130a may connect outputs of the plurality of voltage generators 131a to 13na with the corresponding driving lines Si_a to Si_n.

Afterwards, at a first point in time t1, the output of the first voltage generator 131a may reach the first non-selection read voltage VREAD1. In this case, at the first point in time t1, the first switching signal SW1 may switch to the off-state OFF. The voltage generating circuit 130a may disconnect the output of the first voltage generator 131a from the a-th driving lines Si_a in response to the first switching signal SW1 of the off-state. As such, wordlines of the a-th wordline zone WZa corresponding to the a-th driving lines Si_a may be set up to the first non-selection read voltage VREAD1 and may be floated.

Likewise, at a second point in time t2, the output of the second voltage generator 132a may reach the second non-selection read voltage VREAD2; in this case, the second switching signal SW2 may transition to the off-state. The voltage generating circuit 130a may disconnect the output of the second voltage generator 132a from the b-th driving lines Si_b in response to the second switching signal SW2 of the off-state. As such, wordlines of the b-th wordline zone WZb corresponding to the b-th driving lines Si_b may be set up to the second non-selection read voltage VREAD2 and may be floated.

Likewise, at a third point in time t3, the output of the n-th voltage generator 13na may reach the n-th non-selection read voltage VREADn; in this case, the n-th switching signal SWn may transition to the off-state. The voltage generating circuit 130a may disconnect the output of the n-th voltage generator 13na from the n-th driving lines Si_n in response to the n-th switching signal SWn of the off-state. As such, wordlines of the n-th wordline zone WZn corresponding to the n-th driving lines Si_n may be set up to the n-th non-selection read voltage VREADn and may be floated.

As described above, the first to n-th non-selection read voltages VREAD1 to VREADn may be used in the read operation of the memory device 100. In this case, the voltage generating circuit 130a of the memory device 100 may include the first to n-th voltage generators 131a to 13na configured to generate the first to n-th non-selection read voltages VREAD1 to VREADn, respectively. In the case where each wordline reaches a target level, the memory device 100 may set up each wordline to the target level by floating the corresponding driving line. As such, power consumption of the memory device 100 may be reduced.

Figure 11:
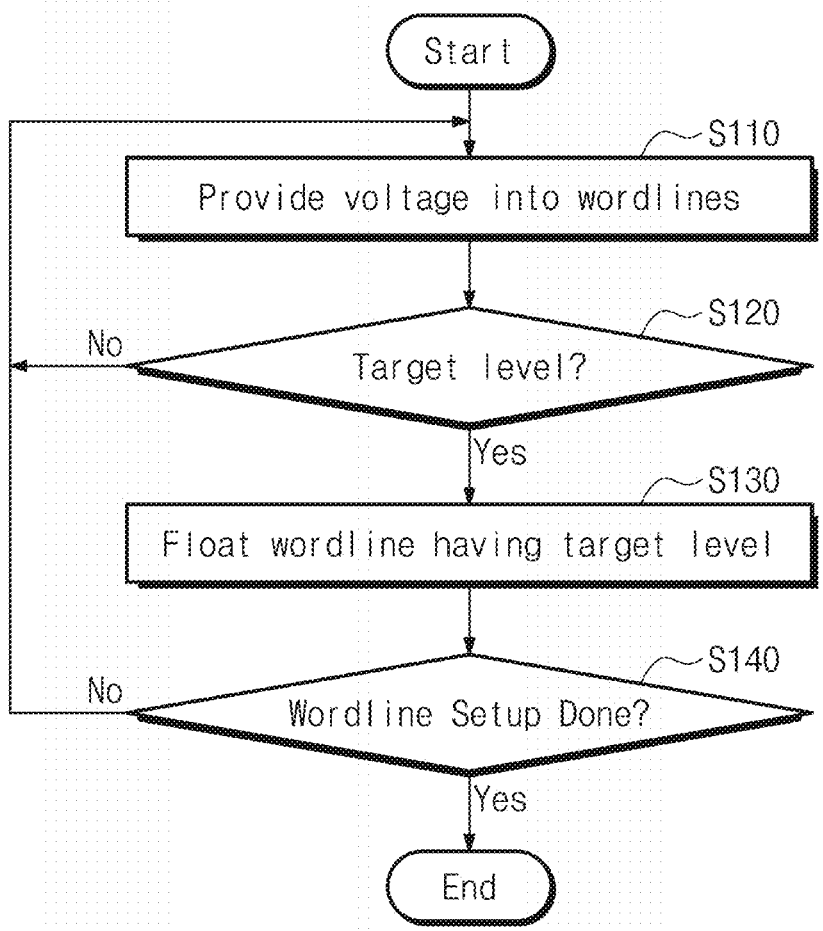
FIG. 11 is a flowchart illustrating an operation of a memory device of FIG. 1.

FIG. 11 is a flowchart illustrating an operation of a memory device of FIG. 1. In an embodiment, the wordline setup operation according to an embodiment of the present disclosure will be described with reference to FIG. 11. In an embodiment, the wordline setup operation means an operation of setting or controlling each of a plurality of wordlines to a given target level for the purpose of performing various operations (e.g., a read operation, a program operation, a verify operation, and an erase operation). That is, it may be understood that the wordline setup operation of the memory device 100 to be described with reference to FIG. 11 may be applied to various operations (e.g., a read operation, a program operation, a verify operation, and an erase operation) of the memory device 100.

Referring to FIGS. 1 and 11, in operation S110, the memory device 100 may provide voltages to a plurality of wordlines. For example, as described with reference to FIGS. 8A and 8B, the memory device 100 may provide the non-selection voltage V_UNSEL to unselected wordlines through driving lines corresponding to the unselected wordlines. Alternatively, as described with reference to FIGS. 10A and 10B, the memory device 100 may provide non-selection voltages to unselected wordlines.

In operation S120, the memory device 100 may determine whether each of the wordlines reaches a corresponding target level. For example, as described above, the plurality of wordlines may be classified into a plurality of wordline zones, and the plurality of wordline zones may have different target levels. The memory device 100 may determine whether wordlines included in each of the plurality of wordline zones reach the corresponding target level.

When there is no wordline reaching the corresponding target level, the memory cell array 110 continues to perform operation S110.

When there is a wordline reaching the corresponding target level, in operation S130, the memory device 100 may float the wordline reaching the corresponding target level. For example, as described with reference to FIGS. 8A and 8B or 10A and 10B, in the case where a voltage level of a specific wordline reaches a target level, the memory device 100 may float a driving line corresponding to the specific wordline. In this case, when the driving line corresponding to the specific wordline is floated, the specific wordline may also maintain the floating state.

In operation S140, the memory device 100 may determine whether all the wordlines are set up (e.g., whether all the wordlines reach the corresponding target levels). When there is a wordline not reaching the corresponding target level, the memory cell array 110 continues to perform operation S110. When all the wordlines are set up (e.g., when all the wordlines reach the corresponding target levels), the wordline setup operation ends.

In an embodiment, after the wordline setup operation ends, the memory device 100 may perform various operations (e.g., a read operation, a program operation, a verify operation, and an erase operation).

Figure 12A:
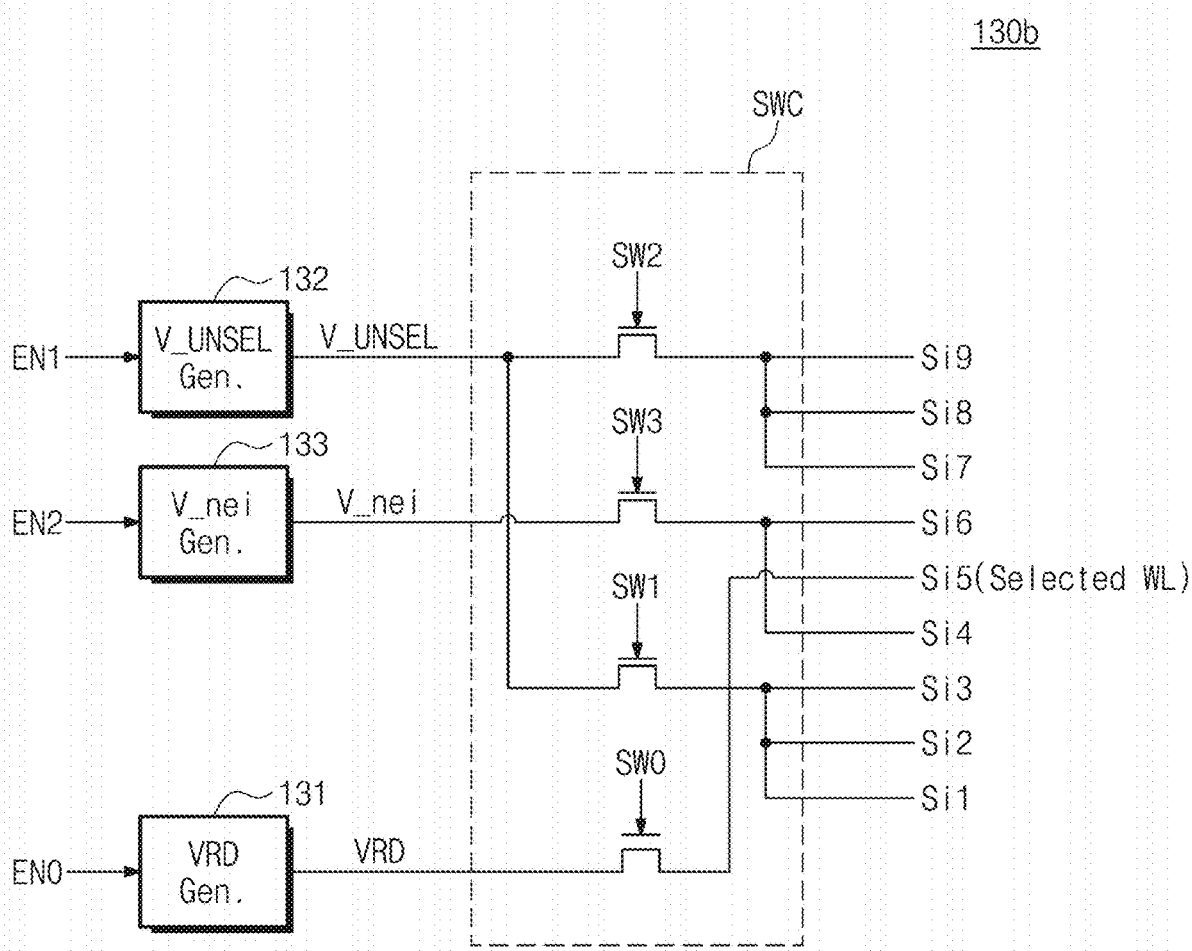
FIG. 12A is a block diagram illustrating a voltage generating circuit of FIG. 1.
Figure 12B:
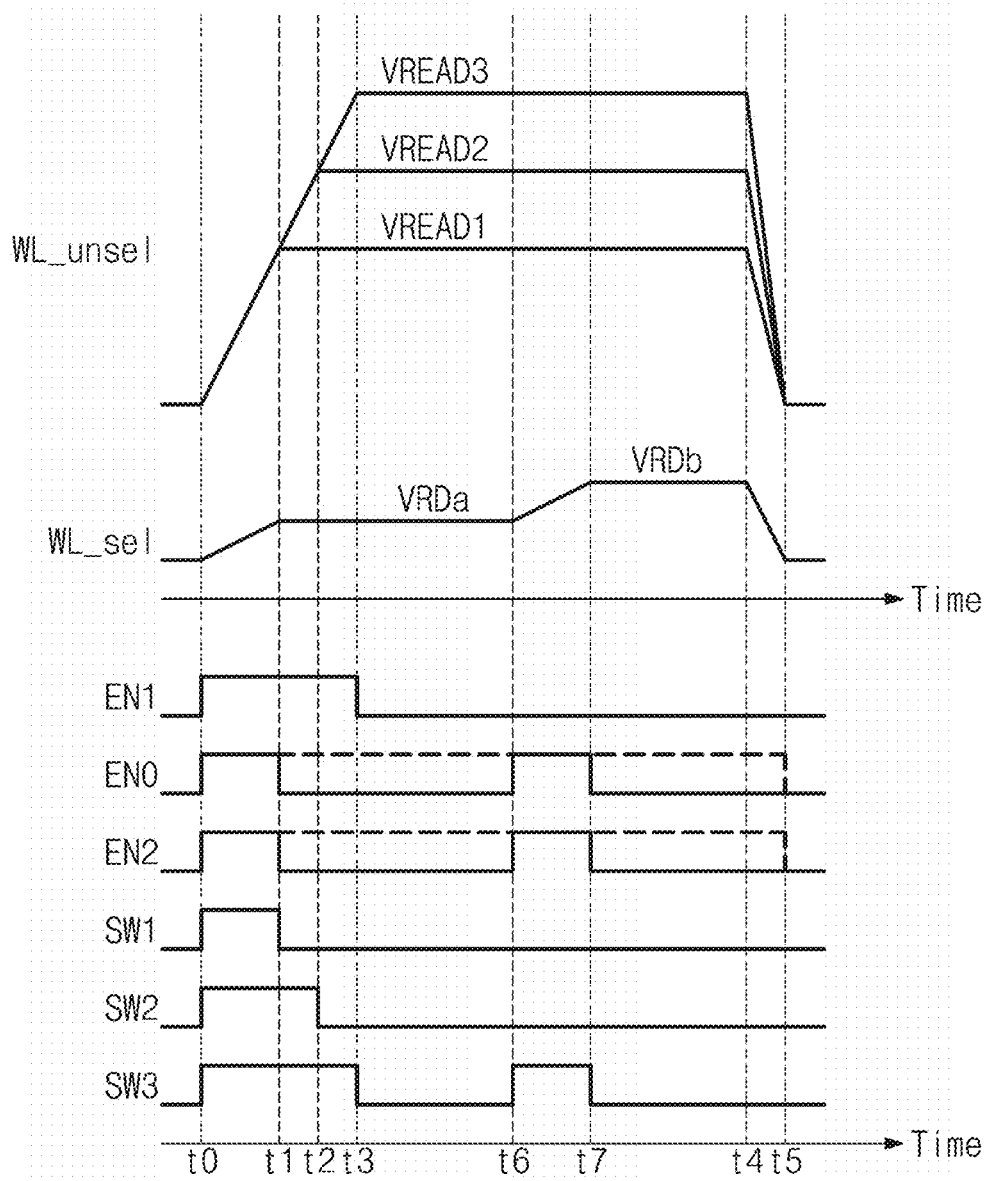
FIG. 12B is a timing diagram for describing an operation of a voltage generating circuit of FIG. 12A.

FIG. 12A is a block diagram illustrating a voltage generating circuit of FIG. 1. FIG. 12B is a timing diagram for describing an operation of a voltage generating circuit of FIG. 12A. Referring to FIGS. 1, 6, 12A, and 12B, a voltage generating circuit 130b may include the switch circuit SWC, the selection read voltage generator 131, the non-selection voltage generator 132, and a neighbor voltage generator 133.

The selection read voltage generator 131 may generate the selection read voltage VRD in response to the 0-th enable signal EN0. The non-selection voltage generator 132 may generate the non-selection voltage V_UNSEL in response to the first enable signal EN1. The neighbor voltage generator 133 may generate a neighbor voltage V_nei in response to a second enable signal EN2. In an embodiment, the neighbor voltage V_nei may be equal to or greater than a non-selection read voltage that is applied to unselected wordlines (e.g., WL4 and WL6) physically adjacent to a selected wordline (e.g., WL5).

The switch circuit SWC may connect the output of the selection read voltage generator 131 with the fifth driving line Si5 (e.g., corresponding to a selected wordline) in response to the 0-th switching signal SW0, may connect the output of the selection read voltage generator 131 with the first to third driving lines Si1 to Si3 in response to the first switching signal SW1, may connect the output of the selection read voltage generator 131 with the seventh to ninth driving lines Si7 to Si9 in response to the second switching signal SW2, and may connect the output of the neighbor voltage generator 133 with the fourth and sixth driving lines Si4 and Si6 in response to the third switching signal SW3.

In an embodiment, as in the above description, each of the first to third switching signals SW1 to SW3 and the 0-th to second enable signals EN0 to EN2 may have the on-state or the off-state depending on whether a corresponding wordline(s) reaches a corresponding target level. For example, as in the description given with reference to FIG. 8B, each of the first to third switching signals SW1 to SW3 and the 0-th to second enable signals EN0 to EN2 may have the on-state or the off-state as shown in a time period from a 0-th point in time t0 to a third point in time t3 of FIG. 12B. Thus, additional description will be omitted to avoid redundancy.

In an embodiment, each of the memory cells included in the memory device 100 may be an MLC, TLC, QLC, or PLC configured to store a plurality of bits. To read a plurality of bits stored in memory cells, the memory device 100 may use a plurality of read voltages. In this case, during one read operation, the memory device 100 may perform a plurality of sensing operations while changing a voltage of a selected wordline.

For example, as illustrated in FIG. 12B, the memory device 100 may perform a sensing operation based on an a-th selection read voltage VRDa during a time period from the third point in time t3 to a sixth point in time t6 and may perform a sensing operation based on a b-th selection read voltage VRDb during a time period from a seventh point in time t7 to a fourth point in time t4. From the sixth point in time t6 to the seventh point in time t7, the memory device 100 may enable the selection read voltage generator 131 (e.g., may maintain the 0-th enable signal EN0 at the on-state) such that a voltage of the selected wordline WL_sel increases from the a-th selection read voltage VRDa to the b-th selection read voltage VRDb.

During the time period from the sixth point in time t6 to the seventh point in time t7, in the case where the fourth and sixth wordlines WL4 and WL6 being unselected wordlines physically adjacent to the fifth wordline WL5 being a selected wordline are at a floating state, the fourth and sixth wordlines WL4 and WL6 may be affected by the coupling coming from the voltage increase of the fifth wordline WL5. To limit and/or prevent the coupling, the memory device 100 may maintain the second enable signal EN2 and the third switching signal SW3 at the on-state during a period where the voltage of the selected wordline WL_sel is changed (e.g., during the time period from the sixth point in time t6 to the seventh point in time t7). As such, the output of the neighbor voltage generator 133 (e.g., the neighbor voltage V_nei)

may be connected with the adjacent unselected wordlines. In this case, because the voltage of the adjacent unselected wordlines is maintained at a given level (e.g., the neighbor voltage V_nei or the third non-selection read voltage VREAD3) during the period where the voltage of the selected wordline WL_sel is changed (e.g., during the time period from the sixth point in time t6 to the seventh point in time t7), the fourth and sixth wordlines WL4 and WL6 may not be affected by the coupling coming from the voltage change of the selected wordline WL_sel.

As described above, in the case where the memory device 100 performs a multi-bit read operation, a voltage level of a selected wordline may be changed during one read operation. To limit and/or prevent adjacent unselected wordline from being affected by the coupling coming from a voltage change of a selected wordline, while a voltage of the selected wordline changes, the memory device 100 may provide a specific voltage (e.g., the neighbor voltage V_nei or the third non-selection read voltage VREAD3) to floated unselected wordlines adjacent to the selected wordline. Accordingly, because the voltage of adjacent unselected wordlines is stabilized, the reliability of the memory device 100 is improved.

Figure 13:
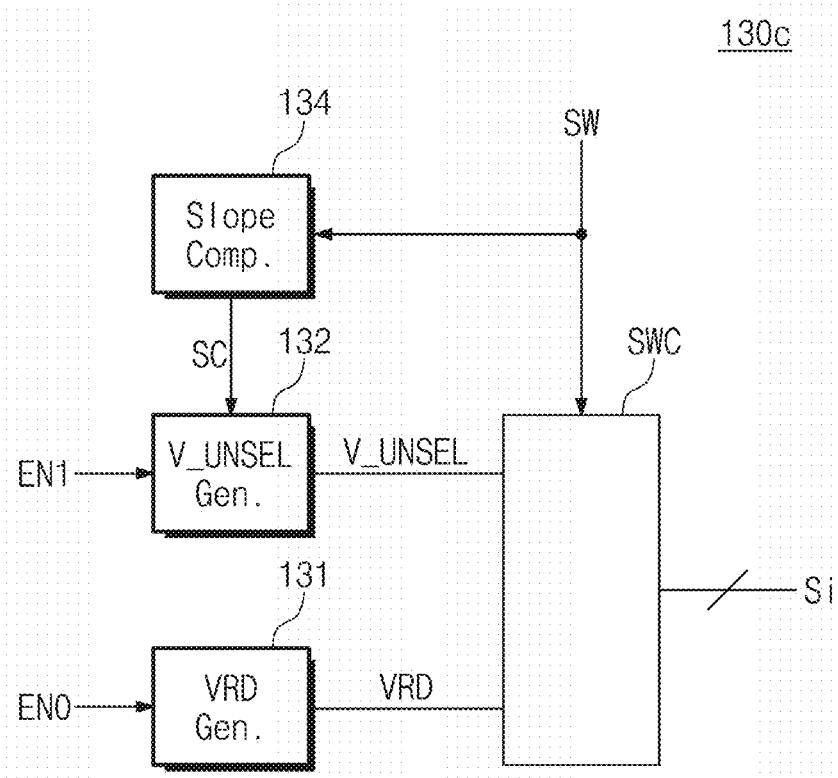
FIG. 13 is a block diagram illustrating a voltage generating circuit of FIG. 1.
Figure 14B:
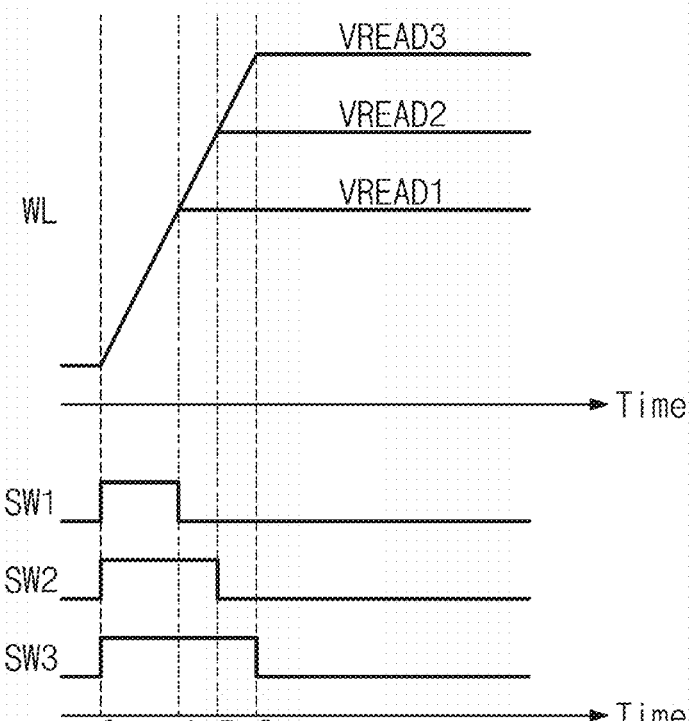

FIG. 13 is a block diagram illustrating a voltage generating circuit of FIG. 1. FIGS. 14A and 14B are timing diagrams for describing an operation of a voltage generating circuit of FIG. 13. Referring to FIGS. 1, 13, 14A, and 14B, a voltage generating circuit 130c may include the switch circuit SWC, the selection read voltage generator 131, the non-selection voltage generator 132, and a slope compensator 134. The switch circuit SWC, the selection read voltage generator 131, the non-selection voltage generator 132 are similar to those described above, and thus, additional description will be omitted to avoid redundancy.

In an embodiment, the slope compensator 134 may compensate for an output of the non-selection voltage generator 132. For example, the non-selection voltage generator 132 may provide voltages to the plurality of wordlines WL, and the number of wordlines WL to be connected may vary depending on the switching signals SW1 to SW3. In the case where a slop is not separately compensated for, a slope of the output of the non-selection voltage generator 132 may vary depending on the number of connected wordlines or connected driving lines.

In detail, as illustrated in FIG. 14A, during a time interval from a 0-th point in time t0 to a first point in time t1, all the first to third switching signals SW1 to SW3 may be at the on-state. In this case, the output of the non-selection voltage generator 132 may be connected with the first to fourth and sixth to ninth driving lines Si1 to Si4 and Si6 to Si9, as described above. That is, the number of driving lines connected with the output of the non-selection voltage generator 132 is 8.

Afterwards, during a time period from the first point in time t1 to a second point in time t2, the first switching signal SW1 is at the off-state, and the second and third switching signals SW2 and SW3 are at the on-state. In this case, the output of the non-selection voltage generator 132 may be connected with the fourth and sixth to ninth driving lines Si4 and Si6 to Si9, as described above. That is, the number of driving lines connected with the output of the non-selection voltage generator 132 is 5.

Afterwards, during a time period from the second point in time t2 to a third point in time t3, the first and second switching signals SW1 and SW2 are at the off-state, and the third switching signal SW3 is at the on-state. In this case, the output of the non-selection voltage generator 132 may be connected with the fourth and sixth driving lines Si4 and Si6, as described above. That is, the number of driving lines connected with the output of the non-selection voltage generator 132 is 2.

That is, the number of driving lines connected with the output of the non-selection voltage generator 132 may vary depending on the time periods. This means that the load of the output of the non-selection voltage generator 132 is variable. As such, the output of the non-selection voltage generator 132 may have different slopes in the time periods. For example, as illustrated in FIG. 14A, during the time period from t0 to t1, in which the load is relatively large, a wordline voltage may increase relatively slowly compared to the remaining time periods. In this case, the wordline setup may be unstable, or it may be difficult to control the plurality of switching signals SW1 to SW3.

In contrast, according to an embodiment of the present disclosure, the slope compensator 134 may perform slope compensation on the output of the non-selection voltage generator 132 based on a plurality of switching signals SW. For example, the slope compensator 134 may determine the number of driving lines connected with the non-selection voltage generator 132 (e.g., the magnitude of the output load of the non-selection voltage generator 132) based on the plurality of switching signals SW and may provide a compensation signal SC to the non-selection voltage generator 132 based on a result of the determination. The non-selection voltage generator 132 may perform slope compensation on the output of the non-selection voltage generator 132 in response to the compensation signal SC. That is, as the load increases (that is, the number of driving lines connected with the output of the non-selection voltage generator 132 increases), the slope compensator 134 may perform slope compensation such that the slope of the output of the non-selection voltage generator 132 increases more rapidly. In this case, as illustrated in FIG. 14B, the output of the non-selection voltage generator 132 may increase at substantially the same slope in the whole period in which the wordlines WL are set up (e.g., in a time period from t0 to t4, a time period from t4 to t5, and a time period from t5 to t6). As such, a wordline setup time may be shortened; because the slope of the output of the non-selection voltage generator 132 is substantially uniform, it may be easy to control the switching signal SW.

Figure 15:
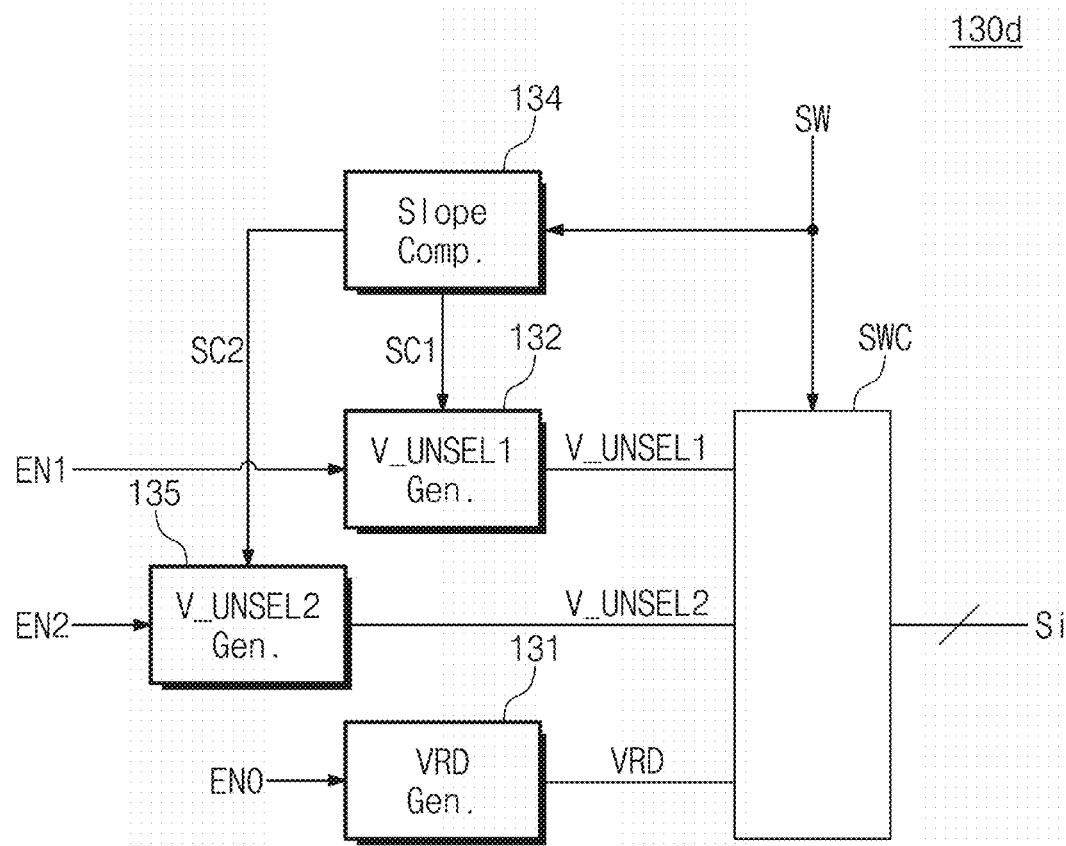
FIG. 15 is a block diagram illustrating a voltage generating circuit of FIG. 1.
Figure 16B:
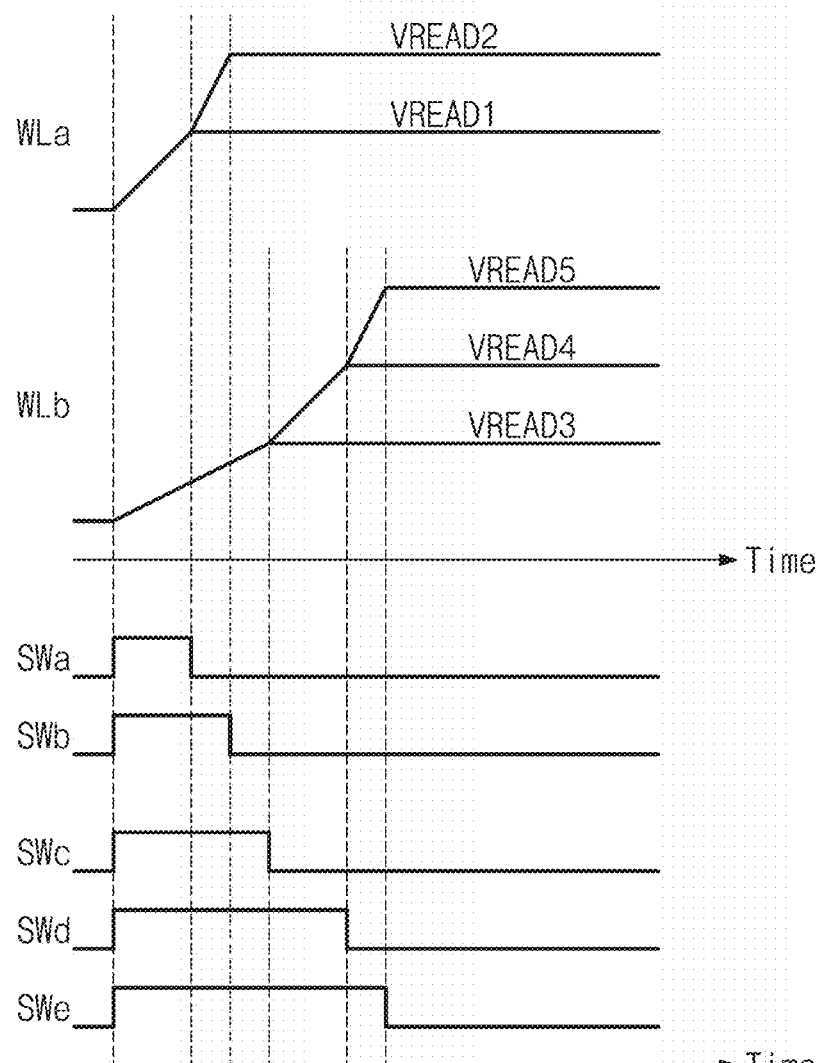

FIG. 15 is a block diagram illustrating a voltage generating circuit of FIG. 1. FIGS. 16A to 16C are diagrams for describing a voltage generating circuit of FIG. 15. Referring to FIGS. 1, 15, 16A, 16B, and 16C, a voltage generating circuit 130d may include the switch circuit SWC, the selection read voltage generator 131, a first non-selection voltage generator 132, a second non-selection voltage generator 135, and the slope compensator 134.

The selection read voltage generator 131 may generate the selection read voltage VRD in response to the 0-th enable signal EN0. The first non-selection voltage generator 132 may generate a first non-selection voltage V_UNSEL1 in response to the first enable signal EN1. The second non-selection voltage generator 135 may generate a second non-selection voltage V_UNSEL2 in response to the second enable signal EN2.

The switch circuit SWC may connect outputs of the selection read voltage generator 131, the first non-selection voltage generator 132, and the second non-selection voltage generator 135 with the plurality of driving lines Si based on the plurality of switching signal SW.

The slope compensator 134 may perform slope compensation on the outputs of the first non-selection voltage generator 132, and the second non-selection voltage generator 135 based on the plurality of switching signal SW. For example, as illustrated in FIG. 16A, the first non-selection voltage generator 132 may be configured to drive a-th and b-th driving lines Sia and Si_b with first and second non-selection read voltages VREAD1 and VREAD2, respectively. The second non-selection voltage generator 135 may be configured to drive c-th, d-th, and e-th driving lines Si_c, Si_d, and Si_e with third, fourth, and fifth non-selection read voltages VREAD3, VREAD4, and VREAD5, respectively.

The number of driving lines to be driven by the first non-selection voltage generator 132 may be different from the number of driving lines to be driven by the second non-selection voltage generator 135. That is, the load of the first non-selection voltage generator 132 may be different from the load of the second non-selection voltage generator 135; in this case, as described above, slopes of the outputs of the first and second non-selection voltage generators 132 and 135 may be different from each other.

For example, as illustrated in FIG. 16B, the first non-selection voltage generator 132 may provide a voltage to the a-th and b-th driving lines Si_a and Si_b during a time period from a 0-th point in time t0 to a first point in time t1 and provides the voltage to the b-th driving lines Si_b during a time period from the first point in time t1 to a second point in time t2. In this case, an a-th switching signal SWa for connecting the output of the first non-selection voltage generator 132 with the a-th driving lines Si_a may be maintained at the on-state during the time period from t0 to t1, and a b-th switching signal SWb for connecting the output of the first non-selection voltage generator 132 with the b-th driving lines Si_b may be maintained at the on-state during the time period from t0 to t2.

The second non-selection voltage generator 135 may provide a voltage to the c-th, d-th, and e-th driving lines Si_c, Si_d, and Si_e during a time period from the 0-th point in time t0 to a third point in time t3, may provide the voltage to the d-th and e-th driving lines Si_d and Si_e during a time period from the third point in time t3 to a fourth point in time t4, and may provide the voltage to the e-th driving lines Si_e during a time period from the fourth point in time t4 to a fifth point in time t5. In this case, a c-th switching signal SWc for connecting the output of the second non-selection voltage generator 135 with the c-th driving lines Si_c may be maintained at the on-state during the time period from t0 to t3, a d-th switching signal SWd for connecting the output of the second non-selection voltage generator 135 with the d-th driving lines Si_d may be maintained at the on-state during the time period from t0 to t4, and an e-th switching signal SWe for connecting the output of the second non-selection voltage generator 135 with the e-th driving lines Si_e may be maintained at the on-state during the time period from t0 to t5.

The number of driving lines connected with non-selection voltage generators may be variable in the respective time periods. Also, the number of driving lines connected with each of the non-selection voltage generators may be variable in the respective time periods. In this case, as illustrated in FIG. 16B, an output of each non-selection voltage generator (or a level of a wordline) may be variable in the respective time periods. In this case, the whole wordline setup time may increase, and it may be difficult to control the timing of the corresponding switching signal.

In contrast, as illustrated in FIG. 15, the slope compensator 134 may determine the load of each of the non-selection voltage generators 132 and 135 or the number of driving lines connected with each of the non-selection voltage generators 132 and 135 based on the switching signal SW, and may provide compensation signals SC1 and SC2 to the non-selection voltage generators 132 and 135 depending on the determined number or the determined load, respectively. The non-selection voltage generator 132 may perform an output slope compensation operation in response to the compensation signal SC1, and the non-selection voltage generator 135 may perform an output slope compensation operation in response to the compensation signal SC2.

For example, as illustrated in FIG. 16C, in the case where the slope compensation is performed on the outputs of the non-selection voltage generators 132 and 135, the outputs of the non-selection voltage generators 132 and 135 may have substantially uniform slopes or substantially the same slopes during the wordline setup period. That is, during a time period from a 0-th point in time t0 to a sixth point in time t6, the first non-selection voltage generator 132 provides a voltage to the a-th and b-th driving lines Si_a and Si_b, and the second non-selection voltage generator 135 provides a voltage to the c-th, d-th, and e-th driving lines Si_c, Si_d, and Si_e. During a time period from the sixth point in time t6 to a seventh point in time t7, the first non-selection voltage generator 132 provides the voltage to the b-th driving lines Si_b, and the second non-selection voltage generator 135 provides the voltage to the d-th and e-th driving lines Si_d and Si_e. During a time period from the seventh point in time t7 to an eighth point in time t8, the second non-selection voltage generator 135 provides the voltage to the e-th driving lines Si_e. In this case, the a-th and c-th switching signals SWa and SWc maintain the on-state during the time period from t0 to t6, the b-th and d-th switching signals SWb and SWd maintain the on-state during the time period from t0 to t7, and the e-th switching signal SWe maintains the on-state during the time period from t0 to t8.

As described above, the slope compensation may be performed on outputs of non-selection voltage generators based on the number of driving lines connected with the non-selection voltage generators or the loads of the non-selection voltage generators. In this case, the whole wordline setup time may be shortened, and it may be easy to control the timing of a switching signal for floating a wordline or a driving line.

Figure 17:
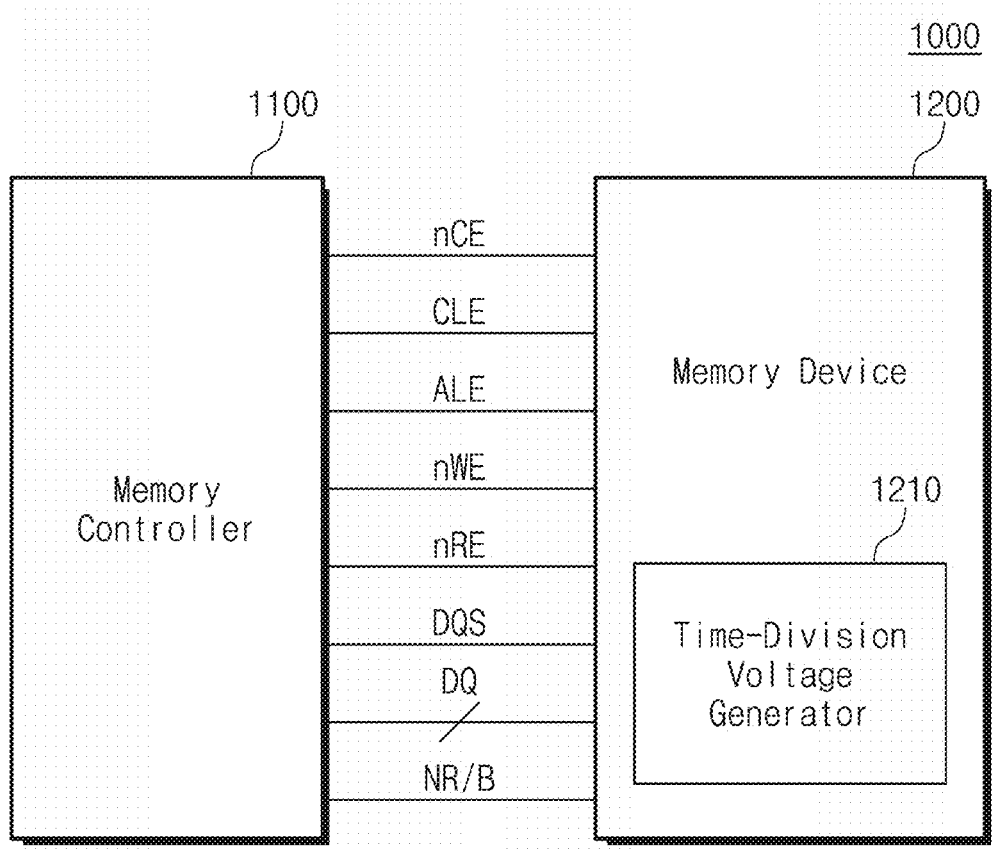
FIG. 17 is a block diagram illustrating a storage device to which a memory device according to an embodiment of the present disclosure is applied.

FIG. 17 is a block diagram illustrating a storage device to which a memory device according to an embodiment of the present disclosure is applied. Referring to FIG. 17, a storage device 1000 may include a memory controller 1100 and a memory device 1200. The memory device 1200 may include a time-division voltage generator 1210. In an embodiment, the time-division voltage generator 1210 may be the voltage generating circuit described with reference to FIGS. 1 to 16C. Alternatively, based on the operation method described with reference to FIGS. 1 to 16C, the time-division voltage generator 1210 may generate various voltages in the time-division manner or may provide various voltages to corresponding components (e.g., wordlines).

The memory controller 1100 may exchange various signals with the memory device 1200 to store data in the memory device 1200 or read data stored in the memory device 1200.

For example, the memory controller 1100 may transmit a chip enable signal nCE, a command latch enable signal CLE, an address latch enable signal ALE, a write enable signal nWE, and a read enable signal nRE to the memory device 1200, may exchange a data strobe signal DQS and data signals DQ with the memory device 1200, and may receive a ready signal (or a busy signal) nR/B from the memory device 1200.

The memory device 1200 may obtain the command CMD from the data signals DQ received in an enable period (e.g., at a high-level state) of the command latch enable signal CLE, based on toggle timings of the write enable signal nWE. The memory device 1200 may obtain the address ADDR from the data signals DQ received in an enable period (e.g., at a high-level state) of the address latch enable signal ALE, based on toggle timings of the write enable signal nWE.

In an embodiment, the write enable signal nWE may maintain a static state (e.g., a high level or a low level) and may then toggle between a high level and a low level. For example, the write enable signal nWE may toggle in a period where the command CMD or the address ADDR is transferred. As such, the memory device 1200 may obtain the command CMD or the address ADDR based on toggle timings of the write enable signal nWE.

In a data output operation of the memory device 1200, the memory device 1200 may receive the toggling read enable signal nRE from the memory controller 1100 before outputting the data "DATA". The memory device 1200 may generate the toggling data strobe signal DQS based on toggling of the read enable signal nRE. For example, the memory device 1200 may generate the data strobe signal DQS that starts to toggle after a given delay (e.g., tDQSRE) from a time at which the read enable signal nRE starts to toggle. The memory device 1200 may transmit the data signals DQ including the data "DATA" in synchronization with toggle timings of the data strobe signal DQS. As such, the data "DATA" may be aligned with the toggle timings of the data strobe signal DQS and may be transmitted to the memory controller 1100.

In a data input operation of the memory device 1200, the memory device 1200 may receive the toggling data strobe signal DQS together with the data signals DQ including the data "DATA" from the memory controller 1100. The memory device 1200 may obtain the data "DATA" from the data signals DQ based on toggle timings of the data strobe signal DQS. For example, the memory device 1200 may obtain the data "DATA" by sampling the data signals DQ at a rising edge and a falling edge of the data strobe signal DQS.

The memory device 1200 may transmit the ready signal (or busy signal) nR/B to the memory controller 1100. When the memory device 1200 is in a busy state (e.g., in the case where internal operations are being performed), the memory device 1200 may transmit the ready signal (or busy signal) nR/B indicating the busy state to the memory controller 1100. When the memory device 1200 is in a ready state (e.g., in the case where internal operations are not performed or are completed), the memory device 1200 may transmit the ready signal (or busy signal) nR/B indicating the ready state to the memory controller 1100.

In an embodiment, the memory device 1200 may include the time-division voltage generator 1210. In this case, the time-division voltage generator 1210 may generate various voltages necessary for the memory device 1200 to operate. In an embodiment, the time-division voltage generator 1210 may generate various voltages (e.g., non-selection read voltages) based on the method described with reference to FIGS. 1 to 16C.

Figure 18A:
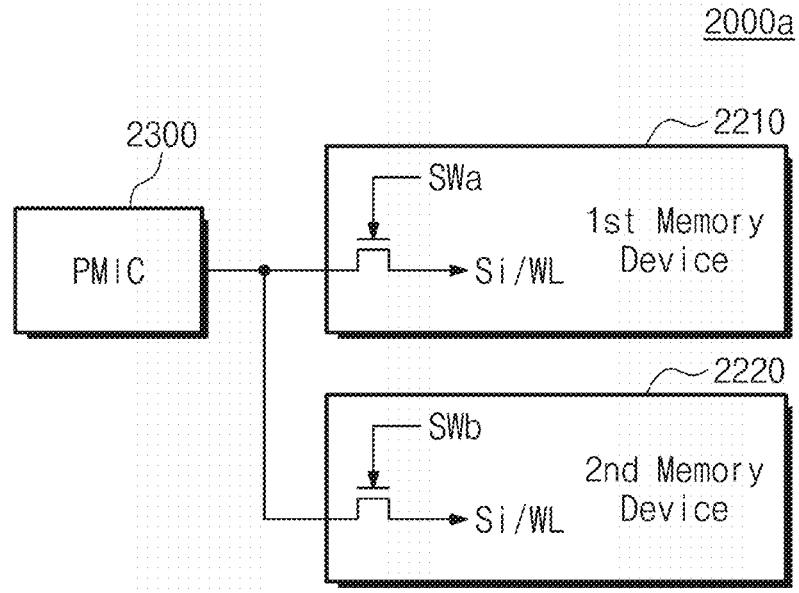
FIGS. 18A and 18B are diagram illustrating storage devices according to an embodiment of the present disclosure.
Figure 18B:
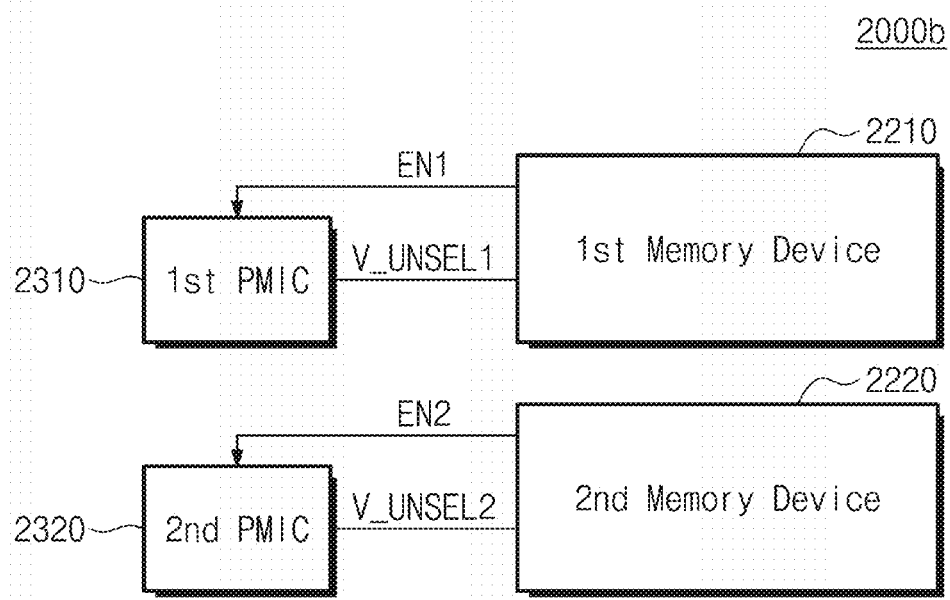

FIGS. 18A and 18B are diagram illustrating storage devices according to an embodiment of the present disclosure. Referring to FIG. 18A, a storage device 2000a may include first and second memory devices 2210 and 2220 and a power management integrated circuit (PMIC) 2300.

The power management integrated circuit 2300 may directly provide various operation voltages to the first and second memory devices 2210 and 2220. For example, in the above embodiments, a memory device generates various operation voltages by using an internal voltage generating circuit. In contrast, in the embodiment of FIG. 18A, the first and second memory devices 2210 and 2220 may be directly provided with various operation voltages from the external power management integrated circuit 2300.

In this case, the power management integrated circuit 2300 may supply the non-selection voltage V_UNSEL to be applied to unselected wordlines or corresponding driving lines Si/WL to the first and second memory devices 2210 and 2220. In this case, as in the above description given with reference to FIGS. 1 to 16C, each of the first and second memory devices 2210 and 2220 may generate the switching signals SWa and SWb for floating unselected wordlines when levels of the unselected wordlines reach corresponding target levels, respectively. A driving method (or an operation method) of each of the first and second memory devices 2210 and 2220 is similar to that described above except that the non-selection voltage V_UNSEL is provided from the external power management integrated circuit 2300 of the first and second memory devices 2210 and 2220, and thus, additional description will be omitted to avoid redundancy.

Referring to FIG. 18B, a storage device 2000b may include the first and second memory devices 2210 and 2220 and first and second power management integrated circuits 2310 and 2320.

The first power management integrated circuit 2310 may directly provide various operation voltages to the first memory device 2210. For example, the first power management integrated circuit 2310 may provide the first non-selection voltage V_UNSEL1 to the first memory device 2210. The first memory device 2210 may provide the first non-selection voltage V_UNSEL1 to unselected wordlines. When the unselected wordlines reach corresponding target levels (e.g., when the wordline setup operation is completed), the first memory device 2210 may change the first enable signal EN1 to the off-state, and the first power management integrated circuit 2310 may stop providing the first non-selection voltage V_UNSEL1 in response to the first enable signal EN1 of the off-state.

The second power management integrated circuit 2320 may directly provide various operation voltages to the second memory device 2220. For example, the second power management integrated circuit 2320 may provide the second non-selection voltage V_UNSEL2 to the second memory device 2220. The second memory device 2220 may provide the second non-selection voltage V_UNSEL2 to unselected wordlines. When the unselected wordlines reach corresponding target levels (e.g., when the wordline setup operation is completed), the second memory device 2220 may change the second enable signal EN2 to the off-state, and the second power management integrated circuit 2320 may stop providing the second non-selection voltage V_UNSEL2 in response to the second enable signal EN2 of the off-state.

Although not explicitly illustrated in the embodiment of FIG. 18B, each of the first and second memory devices 2210 and 2220 may control a switching signal for selectively providing a non-selection voltage to each of unselected wordlines or corresponding driving lines.

Figure 19:
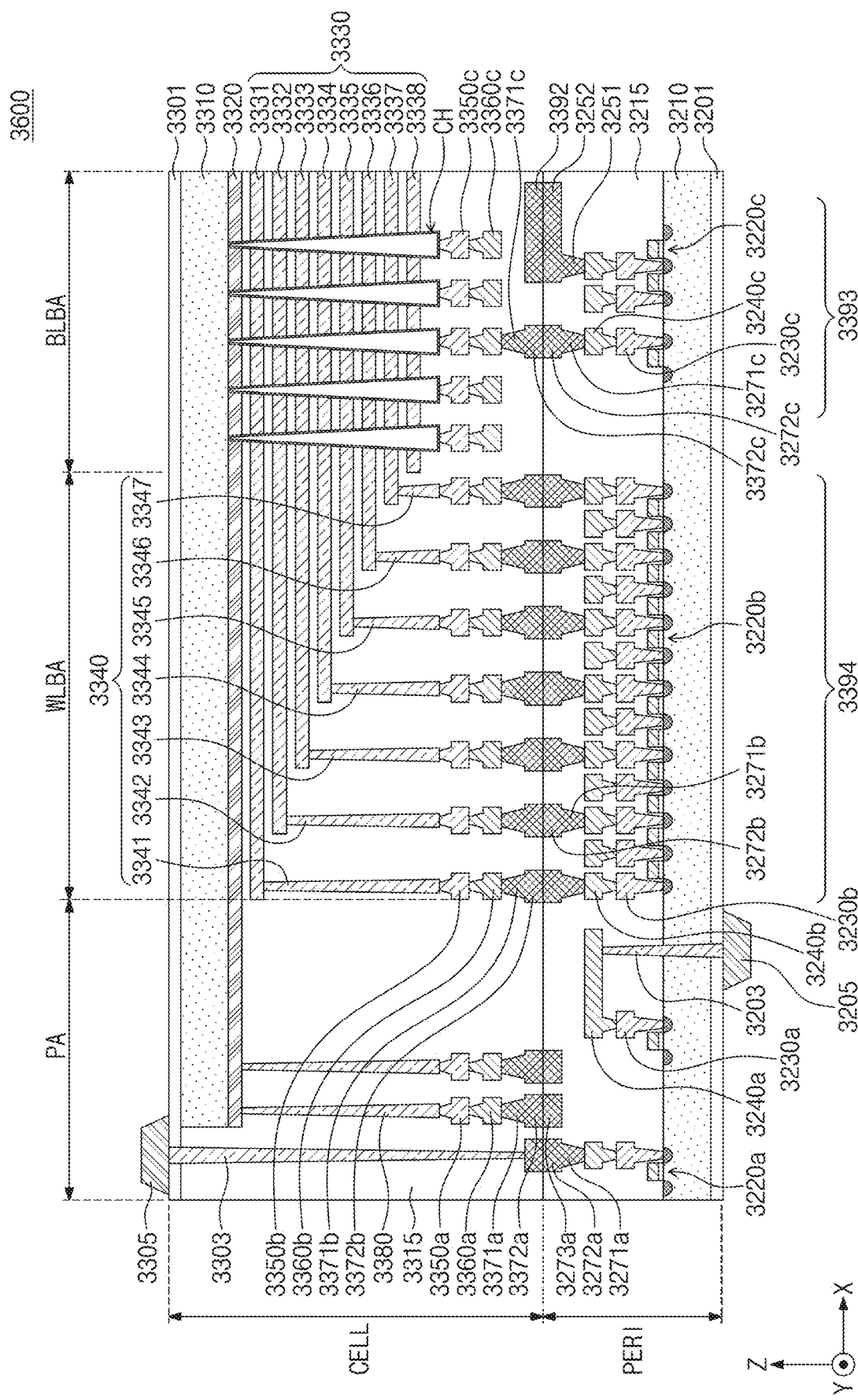
FIG. 19 is a cross-sectional view illustrating a memory device according to an embodiment of the present disclosure.

FIG. 19 is a diagram illustrating a memory device 3600 according to another example embodiment.

Referring to FIG. 19, a memory device 3600 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, may not be limited thereto. For example, the bonding metals may also be formed of aluminum (Al) or tungsten (W).

Each of the peripheral circuit region PERI and the cell region CELL of the memory device 3600 may include an external pad bonding area PA, a word line bonding area WLBA, and a bit line bonding area BLBA.

The peripheral circuit region PERI may include a first substrate 3210, an interlayer insulating layer 3215, a plurality of circuit elements 3220a, 3220b, and 3220c formed on the first substrate 3210, first metal layers 3230a, 3230b, and 3230c respectively connected to the plurality of circuit elements 3220a, 3220b, and 3220c, and second metal layers 3240a, 3240b, and 3240c formed on the first metal layers 3230a, 3230b, and 3230c. In an example embodiment, the first metal layers 3230a, 3230b, and 3230c may be formed of tungsten having relatively high electrical resistivity, and the second metal layers 3240a, 3240b, and 3240c may be formed of copper having relatively low electrical resistivity.

In an example embodiment illustrate in FIG. 19, although only the first metal layers 3230a, 3230b, and 3230c and the second metal layers 3240a, 3240b, and 3240c are shown and described, the example embodiment is not limited thereto, and one or more additional metal layers may be further formed on the second metal layers 3240a, 3240b, and 3240c. At least a portion of the one or more additional metal layers formed on the second metal layers 3240a, 3240b, and 3240c may be formed of aluminum or the like having a lower electrical resistivity than those of copper forming the second metal layers 3240a, 3240b, and 3240c.

The interlayer insulating layer 3215 may be disposed on the first substrate 3210 and cover the plurality of circuit elements 3220a, 3220b, and 3220c, the first metal layers 3230a, 3230b, and 3230c, and the second metal layers 3240a, 3240b, and 3240c. The interlayer insulating layer 3215 may include an insulating material such as silicon oxide, silicon nitride, or the like.

Lower bonding metals 3271b and 3272b may be formed on the second metal layer 3240b in the word line bonding area WLBA. In the word line bonding area WLBA, the lower bonding metals 3271b and 3272b in the peripheral circuit region PERI may be electrically bonded to upper bonding metals 3371b and 3372b of the cell region CELL. The lower bonding metals 3271b and 3272b and the upper bonding metals 3371b and 3372b may be formed of aluminum, copper, tungsten, or the like. Further, the upper bonding metals 3371b and 3372b in the cell region CELL may be referred as first metal pads and the lower bonding metals 3271b and 3272b in the peripheral circuit region PERI may be referred as second metal pads.

The cell region CELL may include at least one memory block. The cell region CELL may include a second substrate 3310 and a common source line 3320. On the second substrate 3310, a plurality of word lines 3331 to 3338 (e.g., 3330) may be stacked in a direction (a Z-axis direction), perpendicular to an upper surface of the second substrate 3310. At least one string select line and at least one ground select line may be arranged on and below the plurality of word lines 3330, respectively, and the plurality of word lines 3330 may be disposed between the at least one string select line and the at least one ground select line.

In the bit line bonding area BLBA, a channel structure CH may extend in a direction (a Z-axis direction), perpendicular to the upper surface of the second substrate 3310, and pass through the plurality of word lines 3330, the at least one string select line, and the at least one ground select line. The channel structure CH may include a data storage layer, a channel layer, a buried insulating layer, and the like, and the channel layer may be electrically connected to a first metal layer 3350c and a second metal layer 3360c. For example, the first metal layer 3350c may be a bit line contact, and the second metal layer 3360c may be a bit line. In an example embodiment, the bit line 3360c may extend in a first direction (a Y-axis direction), parallel to the upper surface of the second substrate 3310.

In an example embodiment illustrated in FIG. 19, an area in which the channel structure CH, the bit line 3360c, and the like are disposed may be defined as the bit line bonding area BLBA. In the bit line bonding area BLBA, the bit line 3360c may be electrically connected to the circuit elements 3220c providing a page buffer 3393 in the peripheral circuit region PERI. The bit line 3360c may be connected to upper bonding metals 3371c and 3372c in the cell region CELL, and the upper bonding metals 3371c and 3372c may be connected to lower bonding metals 3271c and 3272c connected to the circuit elements 3220c of the page buffer 3393. In an example embodiment, a program operation may be executed based on a page unit as write data of the page-unit is stored in the page buffer 3393, and a read operation may be executed based on a sub-page unit as read data of the sub-page unit is stored in the page buffer 3393. Also, in the program operation and the read operation, units of data transmitted through bit lines may be different from each other.

In the word line bonding area WLBA, the plurality of word lines 3330 may extend in a second direction (an X-axis direction), parallel to the upper surface of the second substrate 3310 and perpendicular to the first direction, and may be connected to a plurality of cell contact plugs 3341 to 3347 (e.g., 3340). The plurality of word lines 3330 and the plurality of cell contact plugs 3340 may be connected to each other in pads provided by at least a portion of the plurality of word lines 3330 extending in different lengths in the second direction. A first metal layer 3350b and a second metal layer 3360b may be connected to an upper portion of the plurality of cell contact plugs 3340 connected to the plurality of word lines 3330, sequentially. The plurality of cell contact plugs 3340 may be connected to the peripheral circuit region PERI by the upper bonding metals 3371b and 3372b of the cell region CELL and the lower bonding metals 3271b and 3272b of the peripheral circuit region PERI in the word line bonding area WLBA.

The plurality of cell contact plugs 3340 may be electrically connected to the circuit elements 3220b forming a row decoder 3394 in the peripheral circuit region PERI. In an example embodiment, operating voltages of the circuit elements 3220b of the row decoder 3394 may be different than operating voltages of the circuit elements 3220c forming the page buffer 3393. For example, operating voltages of the circuit elements 3220c forming the page buffer 3393 may be greater than operating voltages of the circuit elements 3220b forming the row decoder 3394.

A common source line contact plug 3380 may be disposed in the external pad bonding area PA. The common source line contact plug 3380 may be formed of a conductive material such as a metal, a metal compound, polysilicon, or the like, and may be electrically connected to the common source line 3320. A first metal layer 3350a and a second metal layer 3360a may be stacked on an upper portion of the common source line contact plug 3380, sequentially. For example, an area in which the common source line contact plug 3380, the first metal layer 3350a, and the second metal layer 3360a are disposed may be defined as the external pad bonding area PA.

Input-output pads 3205 and 3305 may be disposed in the external pad bonding area PA. Referring to FIG. 19, a lower insulating film 3201 covering a lower surface of the first substrate 3210 may be formed below the first substrate 3210, and a first input-output pad 3205 may be formed on the lower insulating film 3201. The first input-output pad 3205 may be connected to at least one of the plurality of circuit elements 3220a, 3220b, and 3220c disposed in the peripheral circuit region PERI through a first input-output contact plug 3203, and may be separated from the first substrate 3210 by the lower insulating film 3201. In addition, a side insulating film may be disposed between the first input-output contact plug 3203 and the first substrate 3210 to electrically separate the first input-output contact plug 3203 and the first substrate 3210.

Referring to FIG. 19, an upper insulating film 3301 covering the upper surface of the second substrate 3310 may be formed on the second substrate 3310, and a second input-output pad 3305 may be disposed on the upper insulating layer 3301. The second input-output pad 3305 may be connected to at least one of the plurality of circuit elements 3220a, 3220b, and 3220c disposed in the peripheral circuit region PERI through a second input-output contact plug 3303. In the example embodiment, the second input-output pad 3305 is electrically connected to a circuit element 3220a.

According to embodiments, the second substrate 3310 and the common source line 3320 may not be disposed in an area in which the second input-output contact plug 3303 is disposed. Also, the second input-output pad 3305 may not overlap the word lines 3330 in the third direction (the Z-axis direction). Referring to FIG. 19, the second input-output contact plug 303 may be separated from the second substrate 3310 in a direction, parallel to the upper surface of the second substrate 3310, and may pass through the interlayer insulating layer 3315 of the cell region CELL to be connected to the second input-output pad 3305.

According to embodiments, the first input-output pad 3205 and the second input-output pad 3305 may be selectively formed. For example, the memory device 3600 may include only the first input-output pad 3205 disposed on the first substrate 3210 or the second input-output pad 3305 disposed on the second substrate 3310. Alternatively, the memory device 3600 may include both the first input-output pad 3205 and the second input-output pad 3305.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 3600 may include a lower metal pattern 3273a, corresponding to an upper metal pattern 3372a formed in an uppermost metal layer of the cell region CELL, and having the same cross-sectional shape as the upper metal pattern 3372a of the cell region CELL so as to be connected to each other, in an uppermost metal layer of the peripheral circuit region PERI. In the peripheral circuit region PERI, the lower metal pattern 3273a formed in the uppermost metal layer of the peripheral circuit region PERI may not be connected to a contact. Similarly, in the external pad bonding area PA, an upper metal pattern 3372a, corresponding to the lower metal pattern 3273a formed in an uppermost metal layer of the peripheral circuit region PERI, and having the same shape as a lower metal pattern 3273a of the peripheral circuit region PERI, may be formed in an uppermost metal layer of the cell region CELL.

The lower bonding metals 3271b and 3272b may be formed on the second metal layer 3240b in the word line bonding area WLBA. In the word line bonding area WLBA, the lower bonding metals 3271b and 3272b of the peripheral circuit region PERI may be electrically connected to the upper bonding metals 3371b and 3372b of the cell region CELL by a Cu-to-Cu bonding.

Further, in the bit line bonding area BLBA, an upper metal pattern 3392, corresponding to a lower metal pattern 3252 formed in the uppermost metal layer of the peripheral circuit region PERI, and having the same cross-sectional shape as the lower metal pattern 3252 of the peripheral circuit region PERI, may be formed in an uppermost metal layer of the cell region CELL. A contact may not be formed on the upper metal pattern 3392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

In an embodiment, the memory device 3600 of FIG. 19 may be at least one of the memory devices described with reference to FIGS. 1 to 18, or may operate based on the operation methods described with reference to FIGS. 1 to 18.

Figure 20:
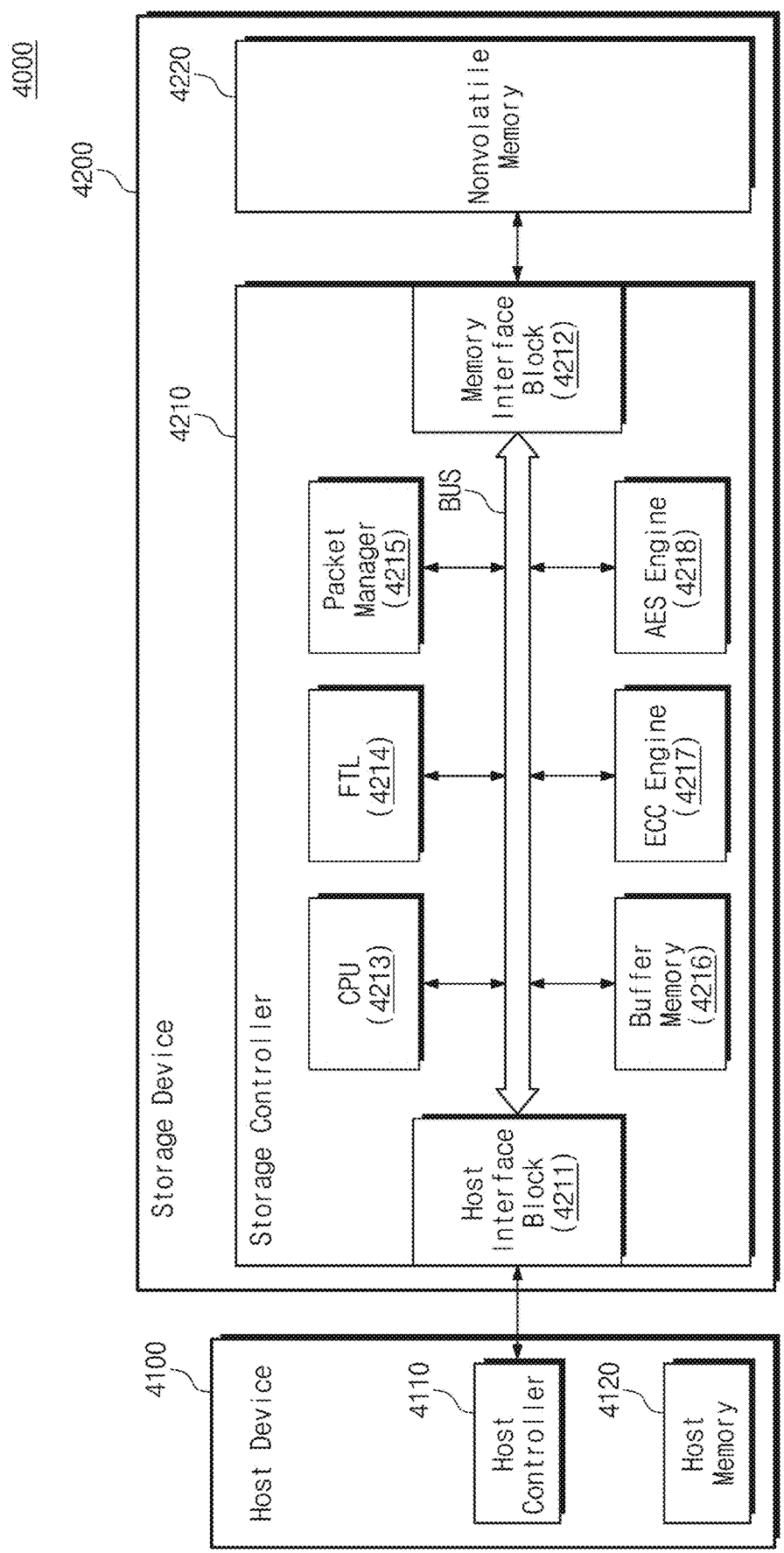
FIG. 20 is a block diagram illustrating a host-storage system according to an embodiment of the present disclosure.

FIG. 20 is a block diagram of a host storage system according to an example embodiment.

Referring to FIG. 20, the host storage system 4000 may include a host 4100 and a storage device 4200. Further, the storage device 4200 may include a storage controller 4210 and an NVM 4220. According to an example embodiment, the host 4100 may include a host controller 4110 and a host memory 4120. The host memory 4120 may serve as a buffer memory configured to temporarily store data to be transmitted to the storage device 4200 or data received from the storage device 4200.

The storage device 4200 may include storage media configured to store data in response to requests from the host 4100. As an example, the storage device 4200 may include at least one of an SSD, an embedded memory, and a removable external memory. When the storage device 4200 is an SSD, the storage device 4200 may be a device that conforms to an NVMe standard. When the storage device 4200 is an embedded memory or an external memory, the storage device 4200 may be a device that conforms to a UFS standard or an eMMC standard. Each of the host 4100 and the storage device 4200 may generate a packet according to an adopted standard protocol and transmit the packet.

When the NVM 4220 of the storage device 4200 includes a flash memory, the flash memory may include a 2D NAND memory array or a 3D (or vertical) NAND (VNAND) memory array. As another example, the storage device 4200 may include various other kinds of NVMs. For example, the storage device 4200 may include magnetic RAM (MRAM), spin-transfer torque MRAM, conductive bridging RAM (CBRAM), ferroelectric RAM (FRAM), PRAM, RRAM, and various other kinds of memories.

According to an embodiment, the host controller 4110 and the host memory 4120 may be implemented as separate semiconductor chips. Alternatively, in some embodiments, the host controller 4110 and the host memory 4120 may be integrated in the same semiconductor chip. As an example, the host controller 4110 may be any one of a plurality of modules included in an application processor (AP). The AP may be implemented as a System on Chip (SoC). Further, the host memory 4120 may be an embedded memory included in the AP or an NVM or memory module located outside the AP.

The host controller 4110 may manage an operation of storing data (e.g., write data) of a buffer region of the host memory 4120 in the NVM 4220 or an operation of storing data (e.g., read data) of the NVM 4220 in the buffer region.

The storage controller 4210 may include a host interface 4211, a memory interface 4212, and a CPU 4213. Further, the storage controllers 4210 may further include a flash translation layer (FTL) 4214, a packet manager 4215, a buffer memory 4216, an error correction code (ECC) engine 4217, and an advanced encryption standard (AES) engine 4218. The storage controllers 4210 may further include a working memory (not shown) in which the FTL 4214 is loaded. The CPU 4213 may execute the FTL 4214 to control data write and read operations on the NVM 4220.

The host interface 4211 may transmit and receive packets to and from the host 4100. A packet transmitted from the host 4100 to the host interface 4211 may include a command or data to be written to the NVM 4220. A packet transmitted from the host interface 4211 to the host 4100 may include a response to the command or data read from the NVM 4220. The memory interface 4212 may transmit data to be written to the NVM 4220 to the NVM 4220 or receive data read from the NVM 4220. The memory interface 4212 may be configured to comply with a standard protocol, such as Toggle or open NAND flash interface (ONFI).

The FTL 4214 may perform various functions, such as an address mapping operation, a wear-leveling operation, and a garbage collection operation. The address mapping operation may be an operation of converting a logical address received from the host 4100 into a physical address used to actually store data in the NVM 4220. The wear-leveling operation may be a technique for limiting and/or preventing excessive deterioration of a specific block by allowing blocks of the NVM 4220 to be uniformly used. As an example, the wear-leveling operation may be implemented using a firmware technique that balances erase counts of physical blocks. The garbage collection operation may be a technique for ensuring usable capacity in the NVM 4220 by erasing an existing block after copying valid data of the existing block to a new block.

The packet manager 4215 may generate a packet according to a protocol of an interface, which consents to the host 4100, or parse various types of information from the packet received from the host 4100. In addition, the buffer memory 4216 may temporarily store data to be written to the NVM 4220 or data to be read from the NVM 4220. Although the buffer memory 4216 may be a component included in the storage controllers 4210, the buffer memory 4216 may be outside the storage controllers 4210.

The ECC engine 4217 may perform error detection and correction operations on read data read from the NVM 4220. More specifically, the ECC engine 4217 may generate parity bits for write data to be written to the NVM 4220, and the generated parity bits may be stored in the NVM 4220 together with write data. During the reading of data from the NVM 4220, the ECC engine 4217 may correct an error in the read data by using the parity bits read from the NVM 4220 along with the read data, and output error-corrected read data.

The AES engine 4218 may perform at least one of an encryption operation and a decryption operation on data input to the storage controllers 4210 by using a symmetric-key algorithm.

In an embodiment, the nonvolatile memory 4220 may be one of the memory devices described with reference to FIGS. 1 to 18B or may operate based on one of the methods described with reference to FIGS. 1 to 18B.

According to the present disclosure, a memory device may generate various driving voltages in a time-division manner. Accordingly, a memory device with the reduced area, reduced power consumption, and improved reliability and an operation method thereof are provided.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A memory device comprising;
   a memory block connected with a plurality of wordlines;
   a voltage generating circuit configured to output a first non-selection voltage through a plurality of driving lines; and
   an address decoding circuit configured to connect the plurality of driving lines with unselected wordlines of the plurality of wordlines,
   wherein, during a wordline setup period for the plurality of wordlines,
   the plurality of driving lines include first driving lines corresponding to first unselected wordlines among the unselected wordlines and second driving lines corresponding to second unselected wordlines among the unselected wordlines,
   the voltage generating circuit is further configured to float the first driving lines when the first unselected wordlines reach a first target level,
   the voltage generating circuit is further configured to float the second driving lines when the second unselected wordlines reach a second target level, and
   the second target level is different from the first target level.

2. The memory device of claim 1, wherein
   the voltage generating circuit includes a first non-selection voltage generator and a switch circuit, the first non-selection voltage generator is configured to output the first non-selection voltage, and
the switch circuit is configured to connect the first driving lines and the second driving lines with an output of the first non-selection voltage generator, to float the first driving lines when the first unselected wordlines reach the first target level, and to float the second driving lines when the second unselected wordlines reach the second target level.

3. The memory device of claim 2, wherein
the first non-selection voltage generator is configured to be disabled when both the first driving lines and the second driving lines are floating.

4. The memory device of claim 2, wherein
the voltage generating circuit further includes a selection read voltage generator configured to output a first selection read voltage,
the switch circuit is further configured to provide the first selection read voltage to a third driving line of the plurality of driving lines, and
the third driving line corresponds to a selected wordline among the plurality of wordlines.

5. The memory device of claim 4, wherein
the voltage generating circuit further includes a second non-selection voltage generator configured to output a second non-selection voltage,
the plurality of driving lines include fourth driving lines corresponding to adjacent unselected wordlines among the unselected wordlines,
the adjacent unselected wordlines are adjacent to the selected wordline,
the switch circuit is further configured to connect the fourth driving lines with the second non-selection voltage generator such that the fourth driving lines are provided with an output of the second non-selection voltage generator and floated when the adjacent unselected wordlines reach a third target level.

6. The memory device of claim 5, wherein the third target level is higher than each of the first target level and the second target level.

7. The memory device of claim 5, wherein
the selection read voltage generator is further configured to increase the first selection read voltage to a second selection read voltage during a sensing operation after the wordline setup period.

8. The memory device of claim 7, wherein
while an output of the selection read voltage generator increases from the first selection read voltage to the second selection read voltage, the switch circuit is further configured to connect the fourth driving lines with the output of the second non-selection voltage generator.

9. The memory device of claim 8, wherein
when the output of the selection read voltage generator increases to the second selection read voltage, the switch circuit is further configured to float the fourth driving lines.

10. The memory device of claim 5, further comprising:
a control logic circuit, wherein
the control logic circuit is configured to change a first switching signal from an on-state to an off-state when the output of the first non-selection voltage generator reaches the first target level,
the control logic circuit is configured to change a second switching signal from the on-state to the off-state when the output of the first non-selection voltage generator reaches the second target level, and the control logic circuit is configured to change a third switching signal from the on-state to the off-state when the output of the first non-selection voltage generator reaches the third target level,
wherein the switch circuit, in response to the first switching signal, is configured to connect the first driving lines with the output of the first non-selection voltage generator or float the first driving lines,
the switch circuit, in response to the second switching signal, is configured to connect the second driving lines with the output of the first non-selection voltage generator or float the second driving lines, and
the switch circuit, in response to the third switching signal, is configured to connect the fourth driving lines with the output of the second non-selection voltage generator or float the fourth driving lines.

11. The memory device of claim 10, wherein
the voltage generating circuit further includes a slope compensator, and
the slope compensator is configured to perform slope compensation on the first non-selection voltage generator and the second non-selection voltage generator based on the first switching signal, the second switching signal, and the third switching signal such that the outputs of the first non-selection voltage generator and the second non-selection voltage generator have a same slope.

12. The memory device of claim 1, wherein
after the wordline setup period is completed, the memory device is configured to perform at least one of a read operation, a program operation, a verify operation, and an erase operation on the memory block.

13. A memory device comprising:
a first voltage generator configured to output a first voltage;
a second voltage generator configured to output a second voltage;
a switch circuit configured to selectively connect an output of the first voltage generator with first driving lines and to connect an output of the second voltage generator with second driving lines;
a memory block connected with a plurality of wordlines; and
an address decoding circuit configured to connect the first driving lines with first unselected wordlines of the plurality of wordlines and to connect the second driving lines with second unselected wordlines of the plurality of wordlines, wherein
the switch circuit is configured to connect the output of the first voltage generator with the first driving lines and to float the first driving lines when the output of the first voltage generator reaches a first target level, and
the switch circuit is configured to connect the output of the second voltage generator with the second driving lines and to float the second driving lines when the output of the second voltage generator reaches a second target level, and
the second target level is different from the first target level.

14. The memory device of claim 13, wherein
the address decoding circuit is further configured to connect third driving lines with third unselected wordlines of the plurality of wordlines,
the switch circuit is further configured to connect the output of the first voltage generator with the third driving lines and to float the third driving lines when the output of the first voltage generator reaches a third target level, and the third target level is different from the first target level.

15. The memory device of claim 13, further comprising:

a third voltage generator configured to output a selection read voltage, wherein the switch circuit is further configured to connect an output of the third voltage generator with a fourth driving line, and wherein the address decoding circuit is further configured to connect the fourth driving line with a selected wordline of the plurality of wordlines.

16. The memory device of claim 15, wherein the second unselected wordlines are unselected wordlines adjacent to the selected wordline, and the switch circuit is further configured to connect the output of the second voltage generator with the second driving lines while a level of the selection read voltage is changed in a sensing operation of the memory device.

17. The memory device of claim 16, wherein the second target level is higher than the first target level.

18. An operation method of a memory device which includes a memory block connected with a plurality of wordlines, the method comprising:

applying a first voltage to unselected wordlines of the plurality of wordlines, the first voltage being generated from a first voltage generator;

floating first unselected wordlines of the unselected wordlines when the first unselected wordlines reach a first target level; and floating second unselected wordlines of the unselected wordlines when the second unselected wordlines reach a second target level, the second target level being higher than the first target level.

19. The method of claim 18, further comprising:

applying a selection read voltage to a selected wordline of the plurality of wordlines, the selection read voltage being generated from a second voltage generator; and sensing data from memory cells connected with the selected wordline when the unselected wordlines reach corresponding target levels, respectively.

20. The method of claim 18, wherein the first voltage generator is disabled when the unselected wordlines reach corresponding target levels, respectively.

* * * * *